US011195560B2

(12) United States Patent
Kaushik et al.

(10) Patent No.: US 11,195,560 B2
(45) Date of Patent: Dec. 7, 2021

(54) INTEGRATED ASSEMBLIES HAVING VOID REGIONS BETWEEN DIGIT LINES AND CONDUCTIVE STRUCTURES, AND METHODS OF FORMING INTEGRATED ASSEMBLIES

(71) Applicant: Micron Technology, Inc., Boise, ID (US)

(72) Inventors: Naveen Kaushik, Boise, ID (US); Fatma Arzum Simsek-Ege, Boise, ID (US); Deepak Chandra Pandey, Uttarakhand (IN)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 16/709,030

(22) Filed: Dec. 10, 2019

(65) Prior Publication Data

US 2021/0174840 A1    Jun. 10, 2021

(51) Int. Cl.
  *G11C 5/06*    (2006.01)
  *H01L 27/108*  (2006.01)

(52) U.S. Cl.
  CPC .......... *G11C 5/063* (2013.01); *H01L 27/1085* (2013.01); *H01L 27/10805* (2013.01); *H01L 27/10873* (2013.01); *H01L 27/10888* (2013.01)

(58) Field of Classification Search
  CPC ............... H01L 27/115; H01L 27/1085; H01L 27/10873; H01L 27/10888
  See application file for complete search history.

(56) References Cited

U.S. PATENT DOCUMENTS

| | | | | |
|---|---|---|---|---|
| 6,967,494 B2* | 11/2005 | Kline | ................ | H01L 23/49805 324/754.18 |
| 7,608,919 B1* | 10/2009 | Bernstein | ............ | H01L 25/0655 257/685 |
| 9,754,946 B1* | 9/2017 | Yang | ................... | H01L 21/7682 |
| 10,658,367 B1* | 5/2020 | Simsek-Ege | ...... | H01L 27/10885 |
| 2007/0023805 A1* | 2/2007 | Wells | ............... | H01L 27/10885 257/295 |
| 2007/0045769 A1* | 3/2007 | Bian | ..................... | H01L 21/762 257/510 |
| 2008/0277713 A1* | 11/2008 | Maekawa | ............. | H01L 27/115 257/316 |
| 2010/0290268 A1* | 11/2010 | Manning | ........... | H01L 27/10823 365/149 |

(Continued)

*Primary Examiner* — Seahvosh Nikmanesh
(74) *Attorney, Agent, or Firm* — Wells St. John P.S.

(57) ABSTRACT

Some embodiments include an integrated assembly having a memory array, and having digit lines extending along a first direction through the memory array. Insulative spacers are along sidewalls of the digit lines. The insulative spacers extend continuously along the digit lines through the memory array. Conductive regions are laterally spaced from the digit lines by intervening regions. The conductive regions are configured as segments spaced apart from one another along the first direction. The intervening regions include regions of the insulative spacers and include void regions adjacent the regions of the insulative spacers. The void regions are configured as void-region-segments which are spaced apart from one another along the first direction by insulative structures. Storage-elements are associated with the conductive regions. Some embodiments include methods of forming integrated assemblies.

22 Claims, 41 Drawing Sheets

(56) References Cited

U.S. PATENT DOCUMENTS

| | | | |
|---|---|---|---|
| 2017/0352666 A1* | 12/2017 | Ahn | H01L 27/10885 |
| 2019/0206872 A1* | 7/2019 | Kim | H01L 27/10855 |
| 2020/0127004 A1* | 4/2020 | Dorhout | H01L 29/7926 |
| 2020/0395363 A1* | 12/2020 | Kim | H01L 27/10814 |
| 2021/0174840 A1* | 6/2021 | Kaushik | H01L 27/10888 |
| 2021/0183873 A1* | 6/2021 | Goodwin | H01L 27/11509 |

* cited by examiner

INTEGRATED ASSEMBLIES HAVING VOID REGIONS BETWEEN DIGIT LINES AND CONDUCTIVE STRUCTURES, AND METHODS OF FORMING INTEGRATED ASSEMBLIES

TECHNICAL FIELD

Integrated assemblies (e.g., DRAM). Integrated assemblies having void regions between digit lines and conductive structures. Methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and with digit lines extending along columns of the array. The wordlines may be coupled with the transistors of the memory cells. Each memory cell may be uniquely addressed through a combination of one of the wordlines with one of the digit lines.

The DRAM architecture may have the digit lines coupled to portions of active regions, and may have the capacitors coupled with interconnects which extend to other portions of the active regions. The interconnects may be proximate to the digit lines, and parasitic capacitance may problematically occur between the interconnects and the digit lines. It would be desirable to develop architectures which alleviate, or even entirely prevent, such parasitic capacitance; and to develop methods of forming such architectures.

BRIEF DESCRIPTION OF THE DRAWINGS

FIG. 1 is a diagrammatic top-down view. FIG. 1C is a diagrammatic cross-sectional top-down view along the line C-C of FIGS. 1A and 1B, respectively. FIGS. 1A and 1B are along the lines A-A and B-B of FIG. 1C, respectively. FIG. 1A is along the line A-A of FIG. 1B, and FIG. 1B is along the B-B of FIG. 1A.

FIG. 2 is a diagrammatic top-down view. FIGS. 2A and 2B are diagrammatic cross-sectional side views along the lines A-A and B-B of FIG. 2, respectively. FIG. 2A is along the line A-A of FIG. 2B, and FIG. 2B is along the B-B of FIG. 2A.

FIG. 3 is a diagrammatic top-down view. FIGS. 3A and 3B are diagrammatic cross-sectional side views along the lines A-A and B-B of FIG. 3, respectively. FIG. 3A is along the line A-A of FIG. 3B, and FIG. 3B is along the B-B of FIG. 3A.

FIG. 4 is a diagrammatic top-down view. FIGS. 4A and 4B are diagrammatic cross-sectional side views along the lines A-A and B-B of FIG. 4, respectively. FIG. 4A is along the line A-A of FIG. 4B, and FIG. 4B is along the B-B of FIG. 4A.

FIG. 5 is a diagrammatic top-down view. FIGS. 5A and 5B are diagrammatic cross-sectional side views along the lines A-A and B-B of FIG. 5, respectively. FIG. 5A is along the line A-A of FIG. 5B, and FIG. 5B is along the B-B of FIG. 5A.

FIG. 6 is a diagrammatic top-down view. FIG. 6C is a diagrammatic top-down sectional view along the line C-C of FIGS. 6A and 6B. FIG. 6A is along the line A-A of FIG. 6B, and FIG. 6B is along the B-B of FIG. 6A.

FIGS. 7, 7A and 7A-1 are diagrammatic views of the regions of the example construction of FIGS. 1-1C at an example process stage following that of FIGS. 5-5B, and alternative to that of FIGS. 6-6C. FIG. 7 is a diagrammatic top-down view. FIGS. 7A and 7A-1 are diagrammatic cross-sectional side views along the lines A-A and A-1-A-1 of FIG. 7, respectively.

FIG. 8 is a diagrammatic top-down view. FIG. 8C is a diagrammatic top-down sectional view along the line C-C of FIGS. 8A and 8B. FIG. 8A is along the line A-A of FIG. 8B, and FIG. 8B is along the B-B of FIG. 8A.

FIG. 9 is a diagrammatic top-down view. FIG. 9C is a diagrammatic top-down sectional view along the line C-C of FIGS. 9A and 9B. FIG. 9A is along the line A-A of FIG. 9B, and FIG. 9B is along the B-B of FIG. 9A.

FIG. 10 is a diagrammatic top-down view. FIGS. 10A and 10B are diagrammatic cross-sectional side views along the lines A-A and B-B of FIG. 10, respectively. FIG. 10A is along the line A-A of FIG. 10B, and FIG. 10B is along the B-B of FIG. 10A.

FIG. 11 is a diagrammatic top-down view. FIGS. 11A and 11B are diagrammatic cross-sectional side views along the lines A-A and B-B of FIG. 11, respectively. FIG. 11A is along the line A-A of FIG. 11B, and FIG. 11B is along the B-B of FIG. 11A.

FIG. 12 is a diagrammatic top-down view. FIG. 12A is a diagrammatic cross-sectional side view along the line A-A of FIG. 12.

DETAILED DESCRIPTION OF THE
ILLUSTRATED EMBODIMENTS

Some embodiments include architectures in which voids are along sidewalls of digit lines, and are between the digit lines and conductive interconnects extending to storage-elements (e.g., capacitors). The voids may alleviate problematic parasitic capacitance as compared to conventional architectures. Some embodiments include methods of forming integrated assemblies. Example embodiments are described with reference to FIGS. 1-14.

Figure 1:
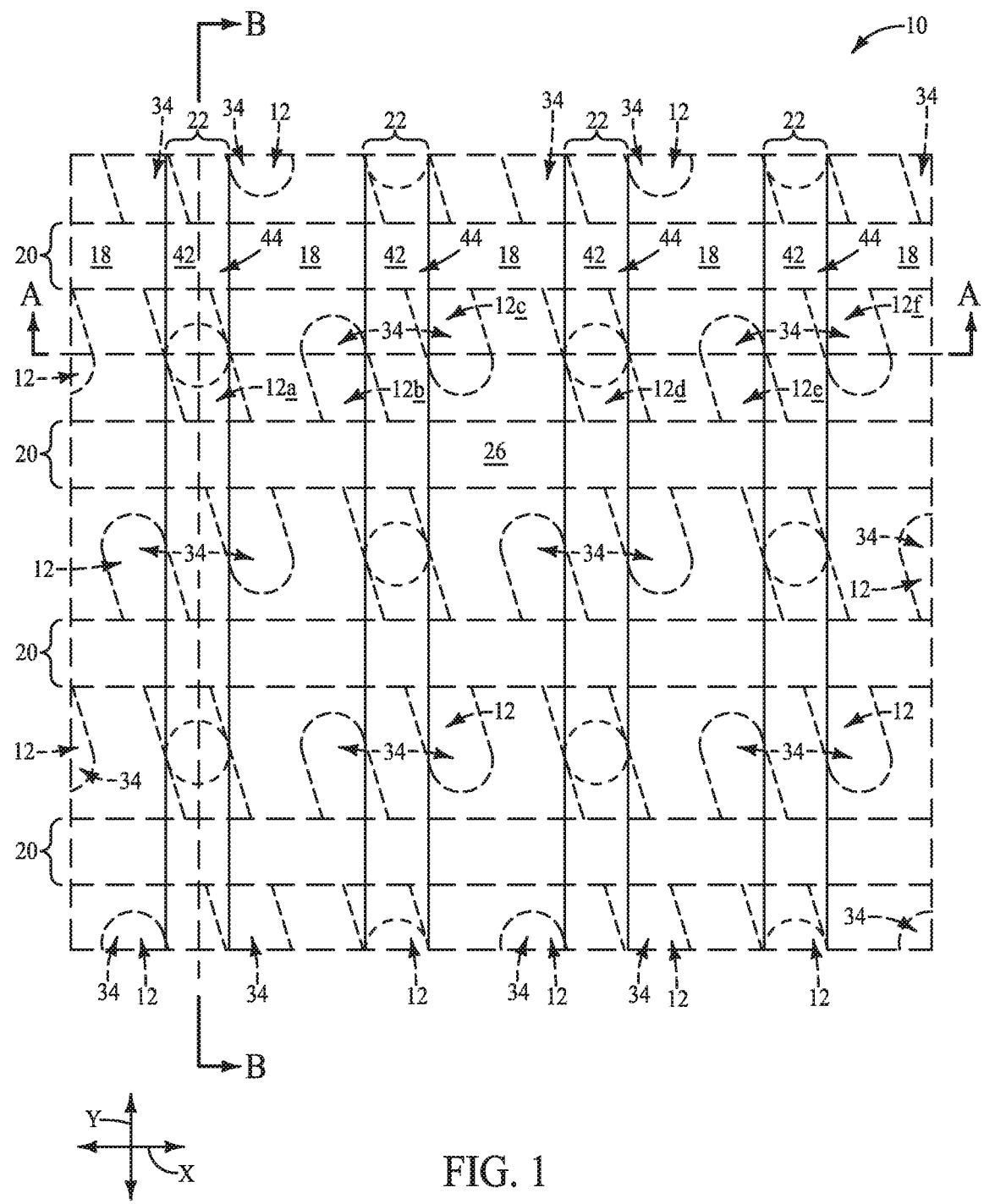
FIGS. 1-1C are diagrammatic views of a region of an example construction at an example process stage.
Figure 1A:
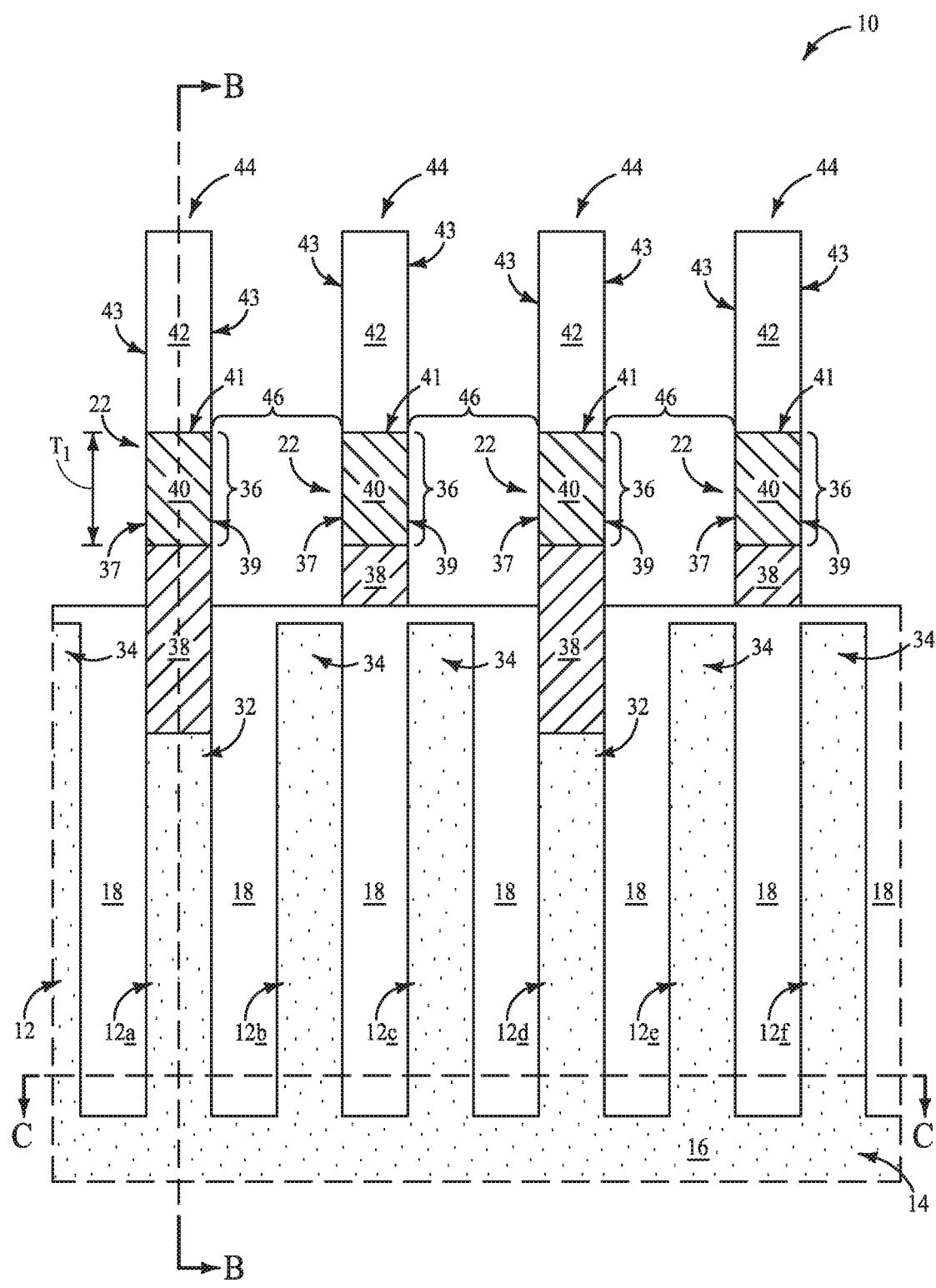
FIGS. 1A and 1B are diagrammatic cross-sectional side views along the lines A-A and B-B of FIG. 1, respectively.
Figure 1B:
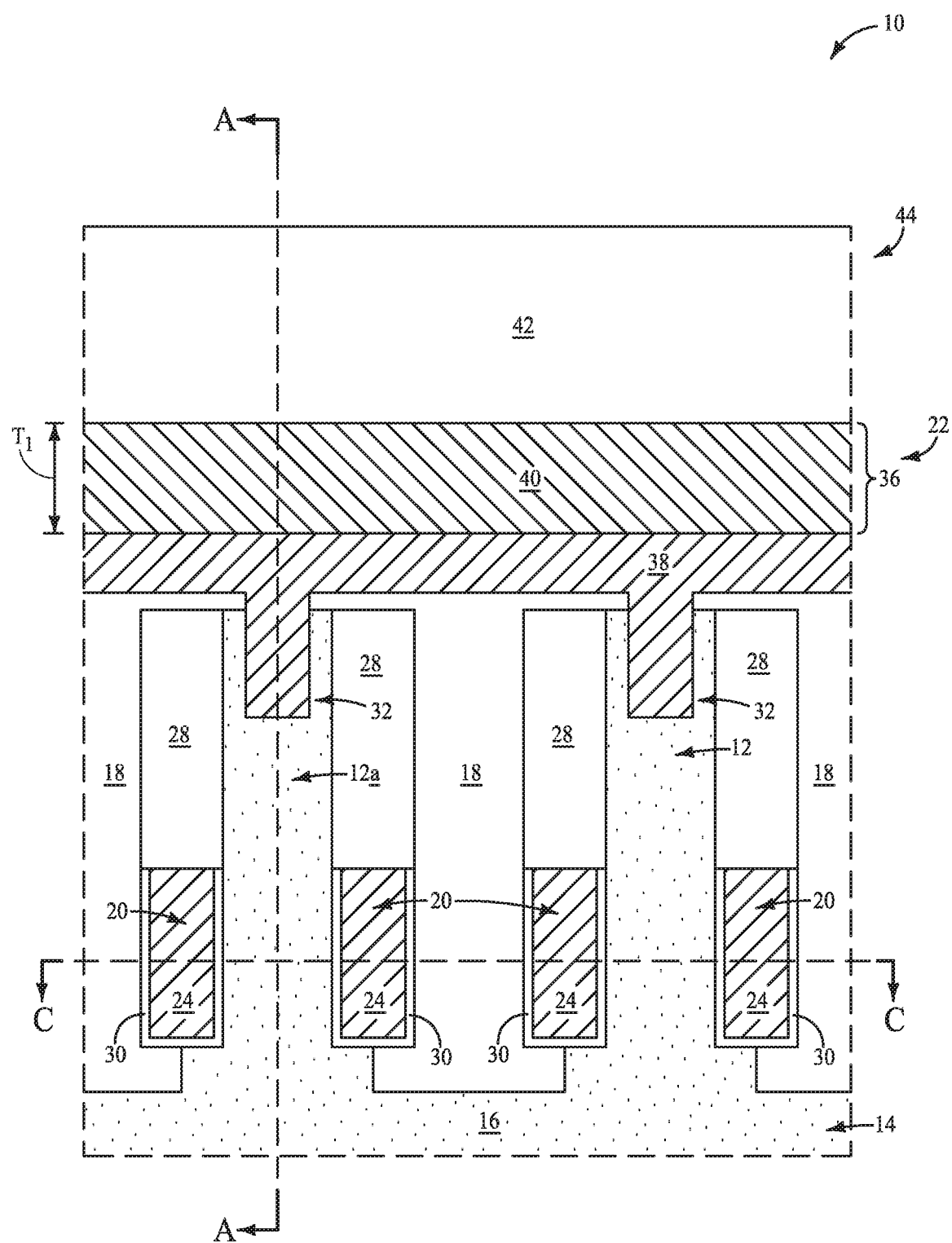
Figure 1C:
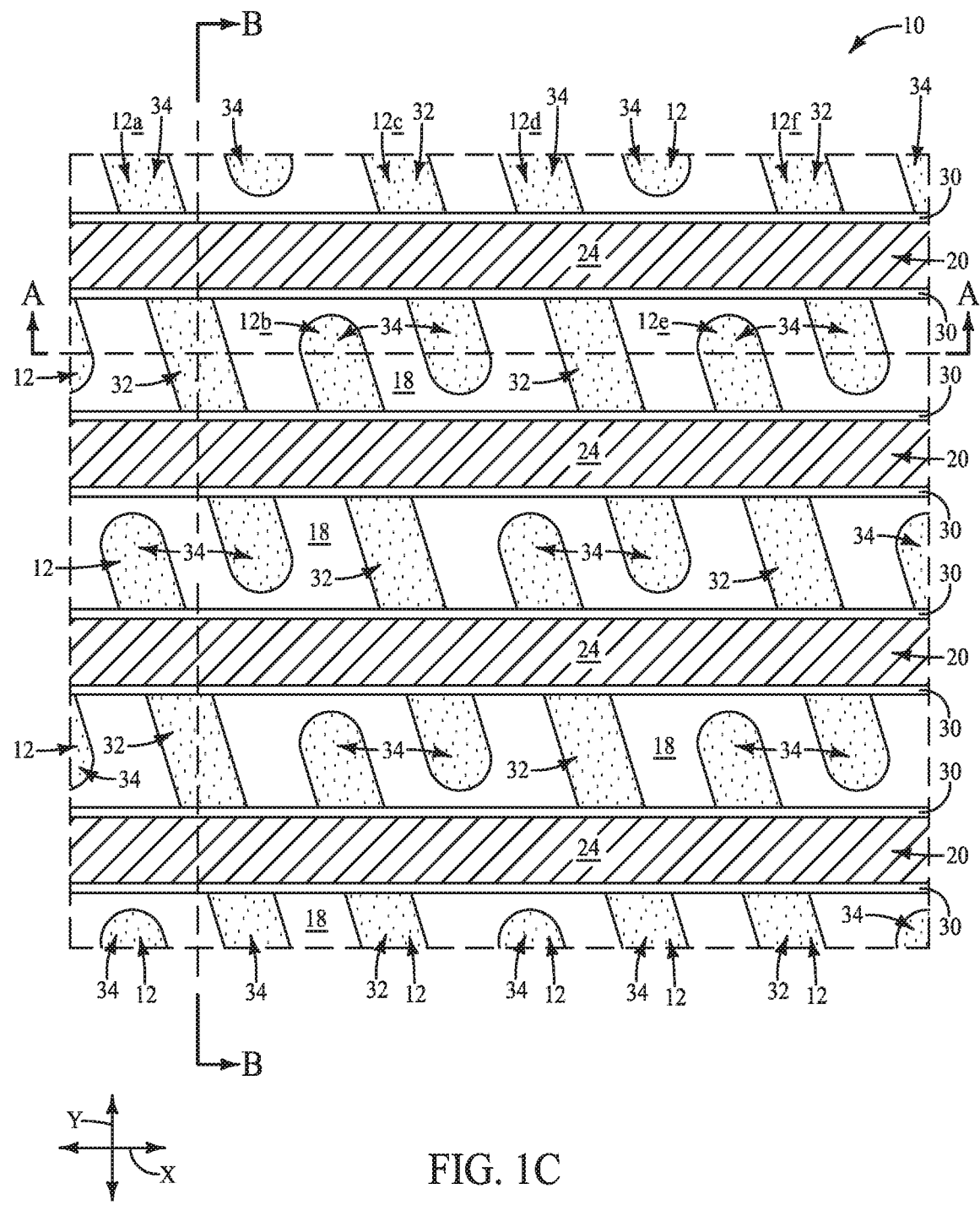

Referring to FIGS. 1-1C, a portion of an example integrated assembly 10 is illustrated. Such assembly may be formed with any suitable methodology. The assembly 10 includes a plurality of active regions 12 (also referred to herein as active-region-pillars) extending upwardly from a semiconductor base 14. Some of the active regions 12 are labeled as 12a-f so that they may be distinguished relative to one another, and relative to others of the active regions. All of the active regions 12 may be substantially identical to one another; with the term "substantially identical" meaning identical to within reasonable tolerances of fabrication and measurement. The active regions 12 are illustrated with dashed lines (phantom view) in FIG. 1 in order to indicate that they are under other materials.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon. In some embodiments, the semiconductor material 16 of the active regions may be referred to as active-region-material.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions comprising insulative materials 18 and 28.

The insulative material 18 may comprise any suitable composition or combination of compositions. The insulative material 18 is shown to be homogeneous to simplify the drawing. In some embodiments, the insulative material 18 may comprise two or more discrete materials. For instance, the insulative material 18 may comprise a nitride layer (e.g., a layer of silicon nitride) over an underlying bulk region comprising silicon dioxide.

The insulative material 28 may comprise any suitable composition(s). The insulative material 28 is shown to be homogeneous to simplify the drawing, but may comprise two or more discrete materials. In some embodiments, the insulative material 28 may comprise, consist essentially of, or consist of silicon dioxide and/or silicon nitride. At least a portion of the insulative material 28 may be the same composition as at least a portion of the insulative material 18, or may be a different composition relative to at least a portion of the insulative material 18.

Wordlines (i.e., access lines) 20 extend along a first direction (represented by an x-axis). The first direction may correspond to a row direction of a memory array. The wordlines 20 are illustrated with dashed lines (phantom view) in FIG. 1 to indicate that they are under other materials. The wordlines are adjacent to the active-region-pillars 12.

The wordlines 20 comprise conductive material 24. The conductive material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The insulative material 28 is over the wordlines 20.

Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

The wordlines 20 comprise transistor gates along the active regions 12. The transistor gates are incorporated into transistors which include channel regions within the active-region-pillars 12, and source/drain regions corresponding to the contact regions 32 and 34 (described below).

Digit lines (i.e., sense-lines, bitlines) 22 extend along a second direction (represented by a y-axis) which may correspond to a column direction of the memory array. The second direction (i.e., the column direction) may be orthogonal to the first direction (i.e., the row direction), or may simply cross the first direction.

The digit lines 22 are over the active-region-pillars 12.

The digit lines 22 comprise metal-containing regions 36 over conductively-doped semiconductor material 38. The semiconductor material 38 may comprise, consist essentially of, or consist of one or more of silicon, germanium, III/V semiconductor material (e.g., gallium phosphide), semiconductor oxide, etc. In some embodiments, the semiconductor material 38 may comprise, consist essentially of, or consist of appropriately-doped silicon. The silicon may be in any suitable form; and in some embodiments may be one or more of polycrystalline, amorphous, etc. The conductively-doped semiconductor material may be n-type doped in some embodiments (e.g., may be silicon doped with phosphorus).

The metal-containing regions 36 comprise metal-containing material 40. The metal-containing material 40 may comprise any suitable composition(s); such as, for example, one or more of various "pure" or "elemental" metals (e.g., titanium, tungsten, cobalt, nickel, platinum, ruthenium, etc.; alone, in mixtures, in alloys, etc.), one or more of various metal-containing compositions (e.g., metal silicide, metal nitride, metal carbide, etc.), etc.

Each of the metal-containing regions 36 has a vertical thickness $T_1$. Such vertical thickness may have any suitable dimension, and in some embodiments may have a dimension within a range of from about 15 nanometers (nm) to about 30 nm. The vertical thickness $T_1$ may be referred to as a first vertical thickness to distinguish it from other vertical thicknesses referred to later in this disclosure.

Insulative material 42 is over the digit lines 22. The insulative material 42 may comprise any suitable composition(s); and in some embodiments may comprise, consist essentially of, or consist of silicon nitride.

The insulative material 42 and digit lines 22 are together patterned as beams 44 which extend along the y-axis direction. In some embodiments, the beams 44 may be considered to extend along a first direction perpendicular to the cross-section of FIG. 1A. Each of the beams along the cross-section of FIG. 1A has sidewall surfaces 43.

The beams 44 may be formed by any suitable methodology. For instance, in some embodiments the materials 38, 40 and 42 may be formed as an expanse across underlying materials of assembly 10, and then such expanse may be patterned utilizing a mask (not shown) and one or more suitable etches.

Each of the digit lines 22 along the cross-section of FIG. 1A has a top surface 41, and a pair of opposing sidewall surfaces 37 and 39 extending downwardly from such top surface. The insulative material 42 is formed directly against the top surfaces 41.

The digit lines 22 may be considered to be spaced from one another by spacing regions 46, with such spacing regions being shown along the cross-section of FIG. 1A.

Each of the active regions (i.e., active-region-pillars) 12 may be considered to comprise a digit-line-contact-region 32 between a pair of storage-element-contact-regions 34. In some embodiments, the regions 32 and 34 may be generically referred to as contact regions.

The wordlines 20 comprise transistor gates which gatedly couple the storage-element-contact-regions 34 with the digit-line-contact-regions 32. The digit-line-contact-regions 32 and the storage-element-contact-regions 34 are indicated in FIG. 1C to assist the reader in understanding the locations of the wordlines 20 relative to the digit-line-contact-regions 32 and the storage-element-contact-regions 34. However, it is to be understood that the digit-line-contact-regions 32 and the storage-element-contact-regions 34 are actually higher up on the active regions than the section of FIG. 1C, as is indicated in FIGS. 1A and 1B.

The digit-line-contact-regions 32 are coupled with the digit lines 22. The storage-element-contact-regions 34 are eventually coupled with storage-elements (e.g., capacitors) as described in more detail below. The storage-element-contact-regions 34 are below the metal-containing regions 36 of the digit lines 22 and within the spacing regions 46, as shown along the cross-section of FIG. 1A.

Figure 2:
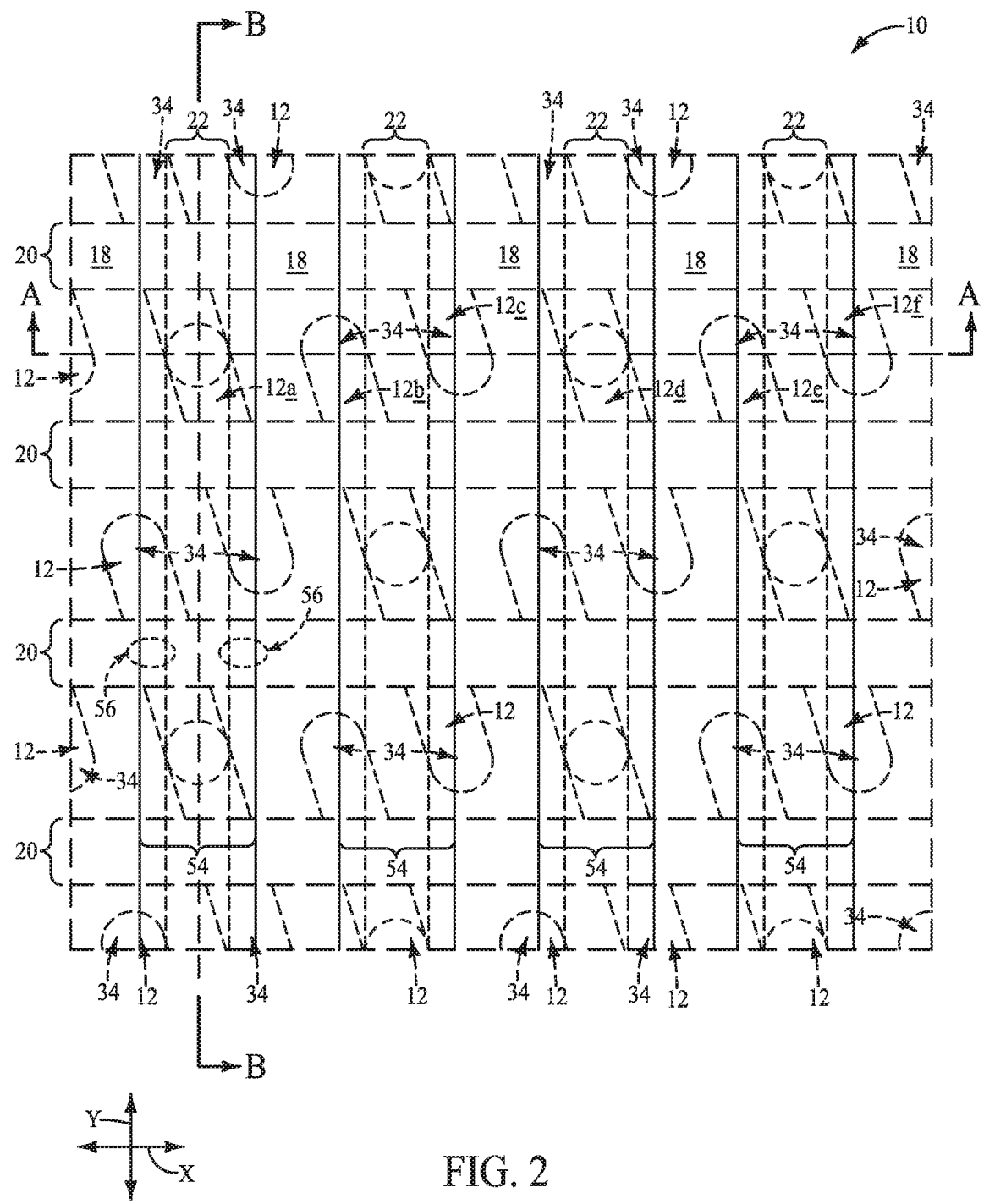
FIGS. 2-2B are diagrammatic views of the regions of the example construction of FIGS. 1-1C at an example process stage following that of FIGS. 1-1C.
Figure 2A:
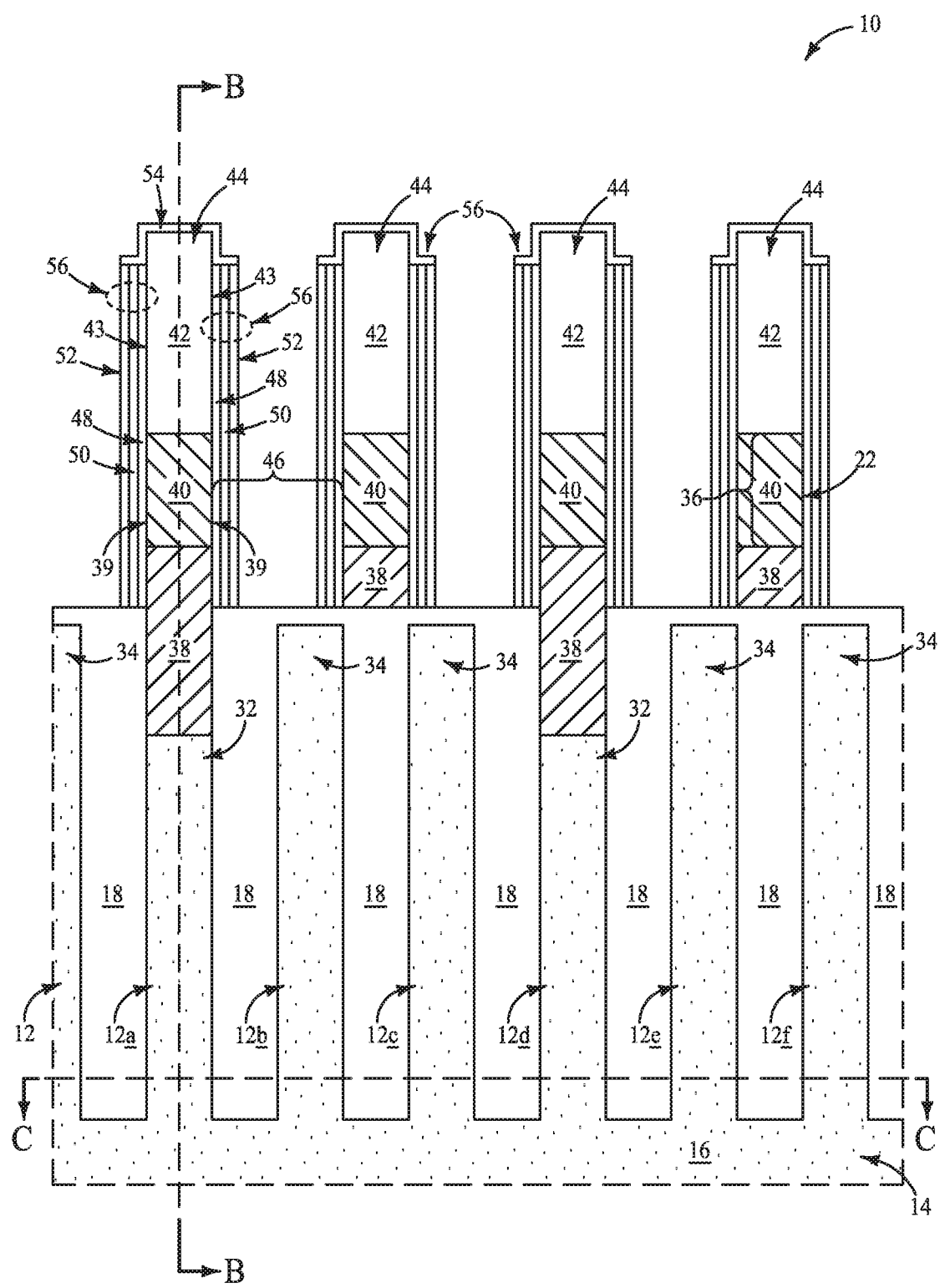
Figure 2B:
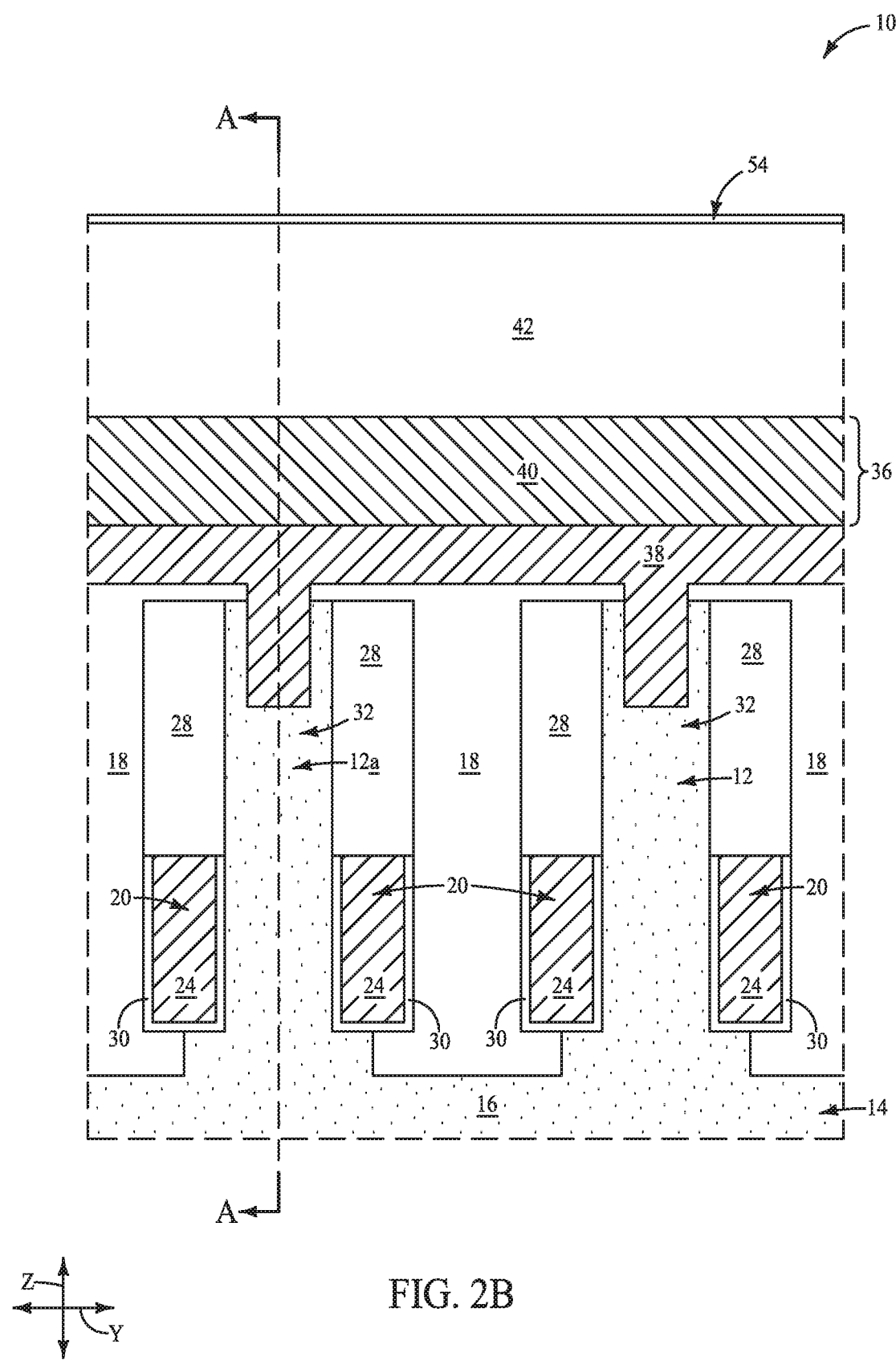

Referring to FIGS. 2-2B, inner (first) panels 48 are formed along the sidewall surfaces 43 of the beams 44, and specifically are formed along the first and second sidewall surfaces 37 and 39 of the metal-containing regions 36 of the digit lines 22. A film (layer, material, etc.) 50 is formed along the inner panels 48. Outer (second) panels 52 are formed along the film 50. An insulative cap 54 is formed over the beam 44, and across the structures 48, 50 and 52.

The panels 48 and 52 may comprise any suitable composition(s); and in some embodiments may comprise, consist essentially of, or consist of silicon nitride.

The insulative cap 54 may comprise any suitable composition(s); and in some embodiments may comprise, consist essentially of, or consist of silicon nitride.

The film 50 may comprise any suitable composition(s); and in some embodiments may comprise a low-k material; with the term low-k meaning a dielectric constant less than that typically associated with silicon dioxide (i.e., less than 3.9). In some embodiments, the film 50 may comprise porous silicon dioxide. In some embodiments, the film 50 may comprise carbon-doped silicon dioxide; with the carbon being present to a concentration within a range of from about 8 atomic percent to about 13 atomic percent. In some embodiments, some or all of the film 50 is ultimately removed, and accordingly the film 50 may be a sacrificial material. If entirety of the film 50 is removed, the film may comprise any material which may be selectively removed relative to the panels 48 and 52, the insulative cap 54 and the region of material 18 under the film 50. In some embodiments, the material 18 may comprise an upper surface comprising silicon nitride. Accordingly, all of the surfaces adjacent the film 50 may comprise silicon nitride, and the sacrificial material 50 may comprise any material which may be selectively removed relative to silicon nitride.

In some embodiments, one or more of the panels 48 and 52 and the insulative cap 54 may comprise a same composition; and in other embodiments one or more of the panels 48 and 52 and the insulative cap 54 may comprise a different composition relative to another of the panels 48 and 52 and the insulative cap 54. In some embodiments, the insulative material 42, panels 48 and 52, and insulative cap 54 may all comprises silicon nitride. However, even in such embodiments, the silicon nitride of the various structures may be distinguishable by appropriate analysis if such silicon nitride is formed by different methodologies (i.e., if a portion of the silicon nitride is formed by chemical vapor deposition to a first density while another portion of the second nitride is formed by atomic layer deposition to a second density).

The structures 48, 50 and 52 may be considered to be configured as rails 56. Also, regions of the insulative cap 54 over the structures 48, 50 and 52 may be considered to be part of the rails 56.

The digit lines 22 are shown in dashed-line view in FIG. 2 to indicate that such digit lines are under the insulative cap 54.

The cross-section of FIG. 1C is not shown relative to the process step of FIGS. 2-2B, or relative to any of the remaining process stages, as nothing significant changes along such cross-section during the illustrated process stages.

Figure 3:
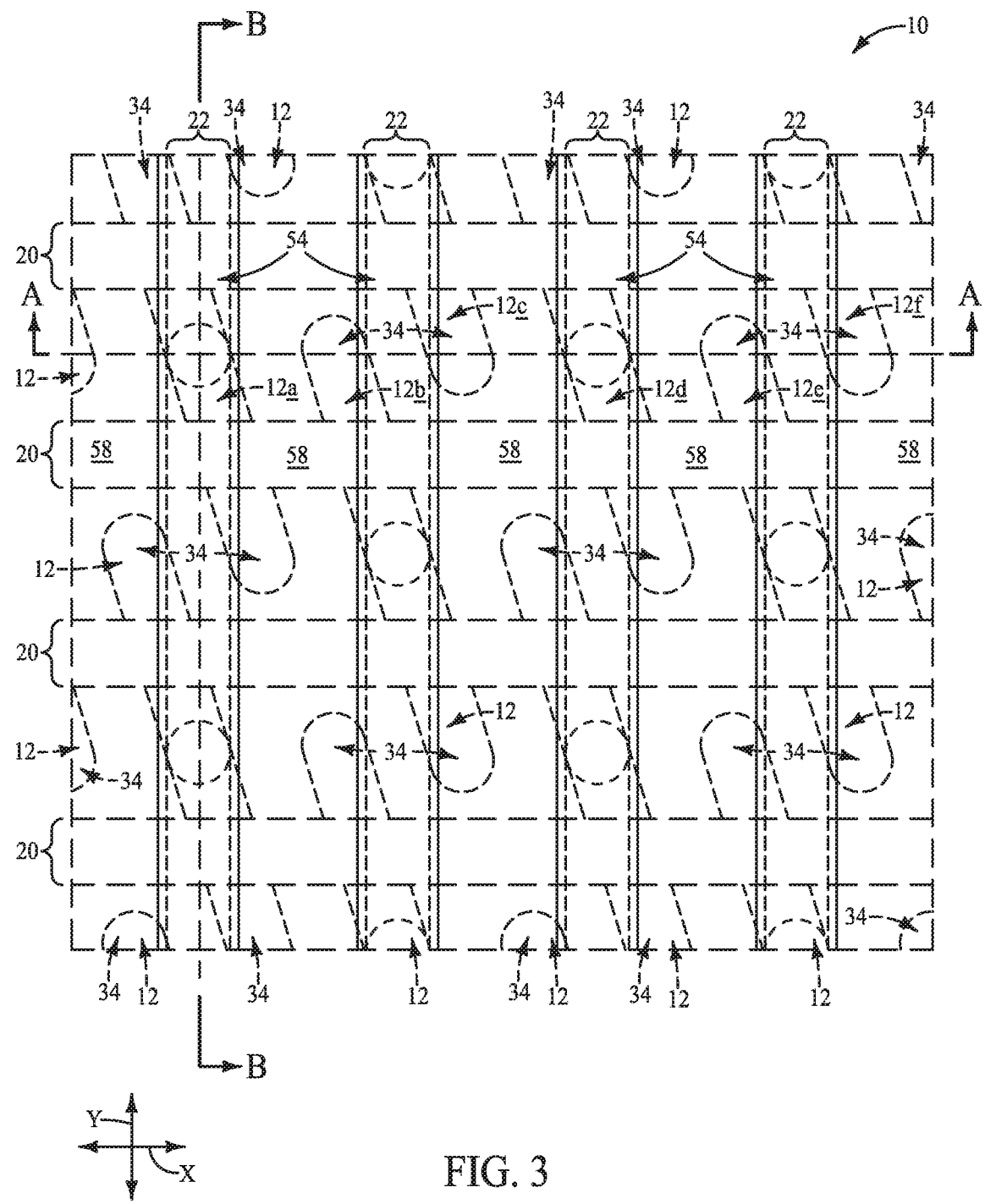
FIGS. 3-3B are diagrammatic views of the regions of the example construction of FIGS. 1-1C at an example process stage following that of FIGS. 2-2B.
Figure 3A:
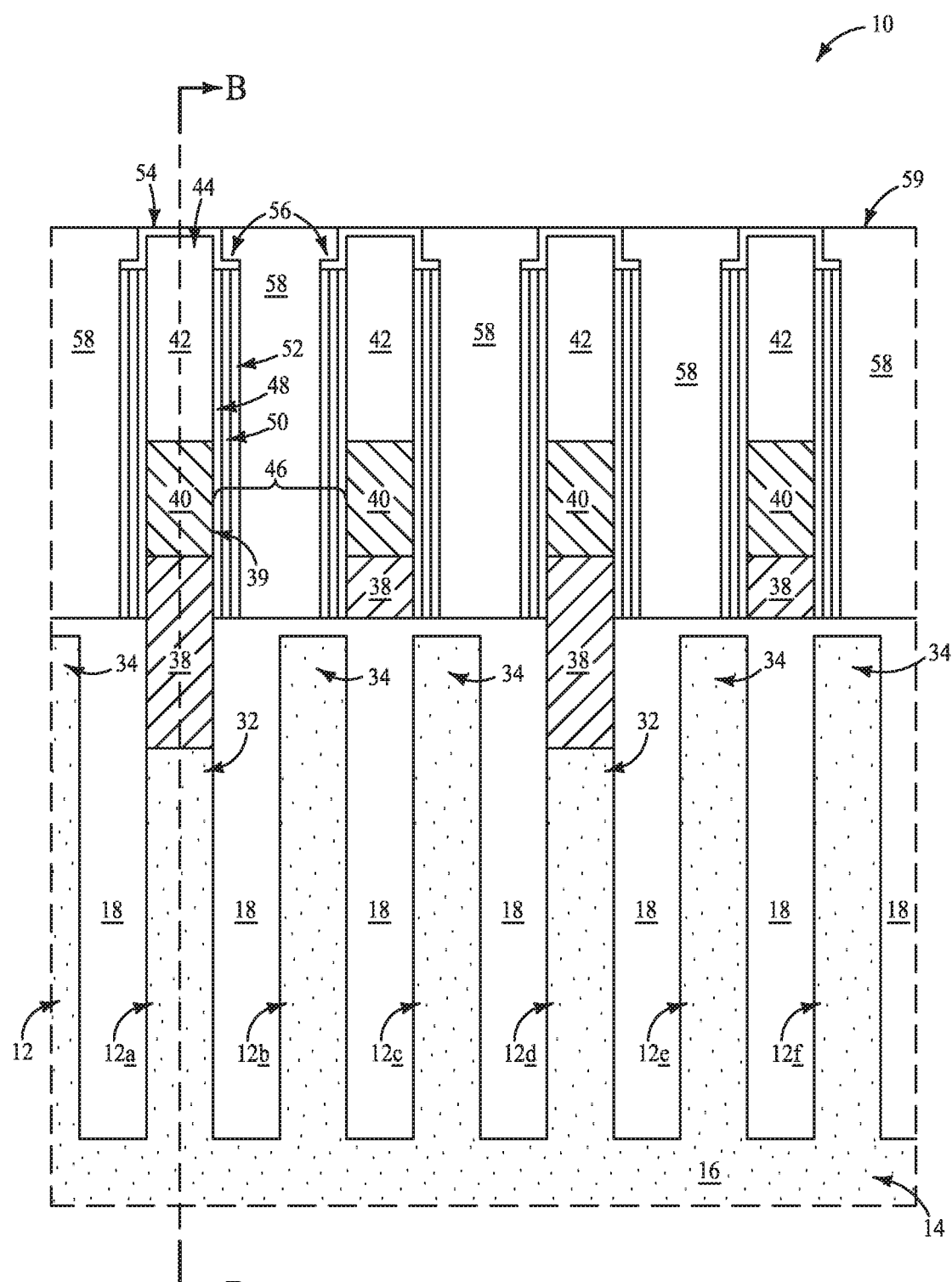
Figure 3B:
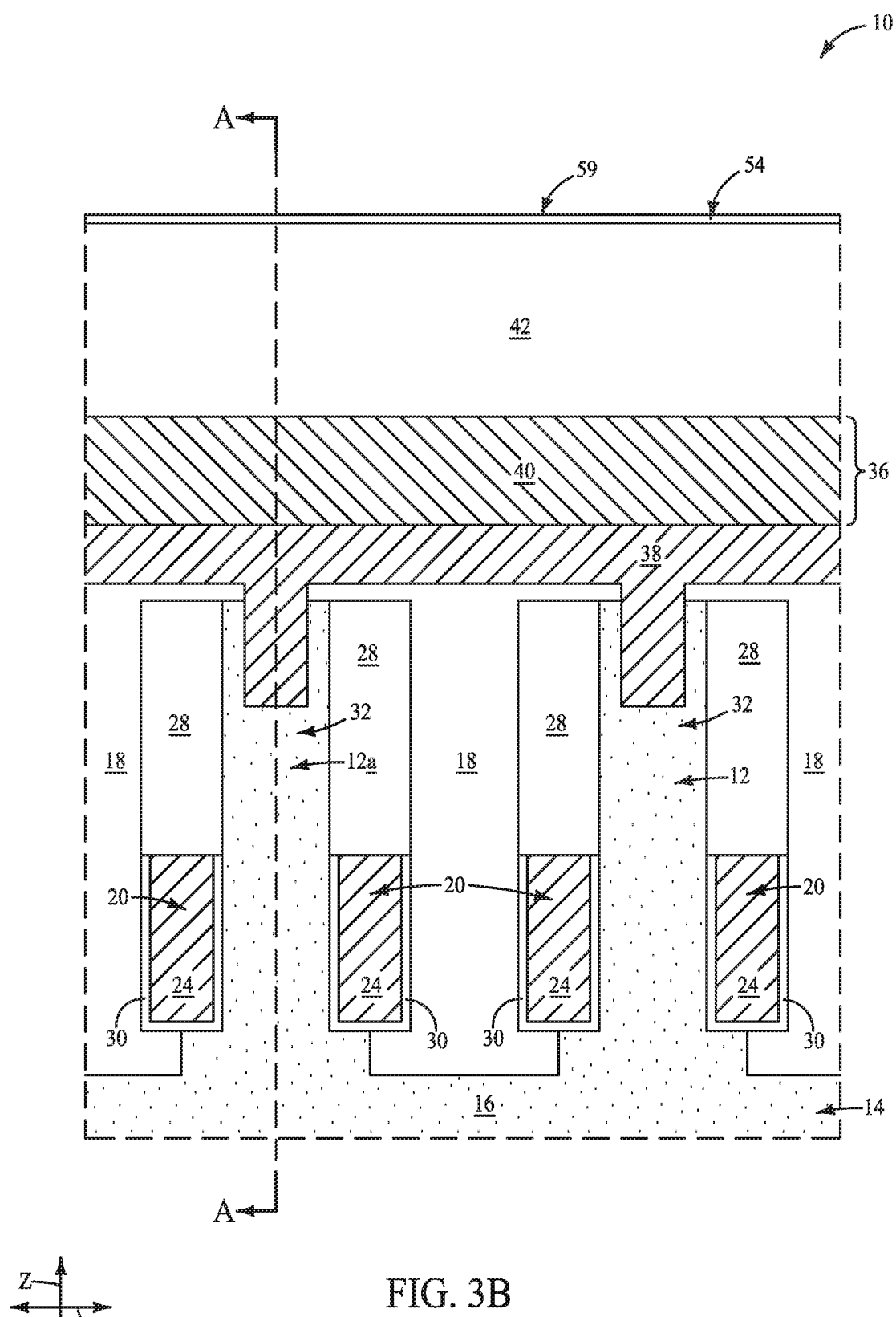

Referring to FIGS. 3-3B, sacrificial material 58 is formed within the spacing regions 46 between the rails 56. The sacrificial material 58 may comprise any suitable composition(s); and in some embodiments may comprise, consist essentially of, or consist of n-type silicon (e.g., n-type amorphous silicon and/or n-type polycrystalline silicon).

In the illustrated embodiment, the assembly 10 is subjected to planarization (i.e., chemical-mechanical polishing) to form a planarized surface 59 extending across the insulative caps 54 and the material 58.

Figure 4:
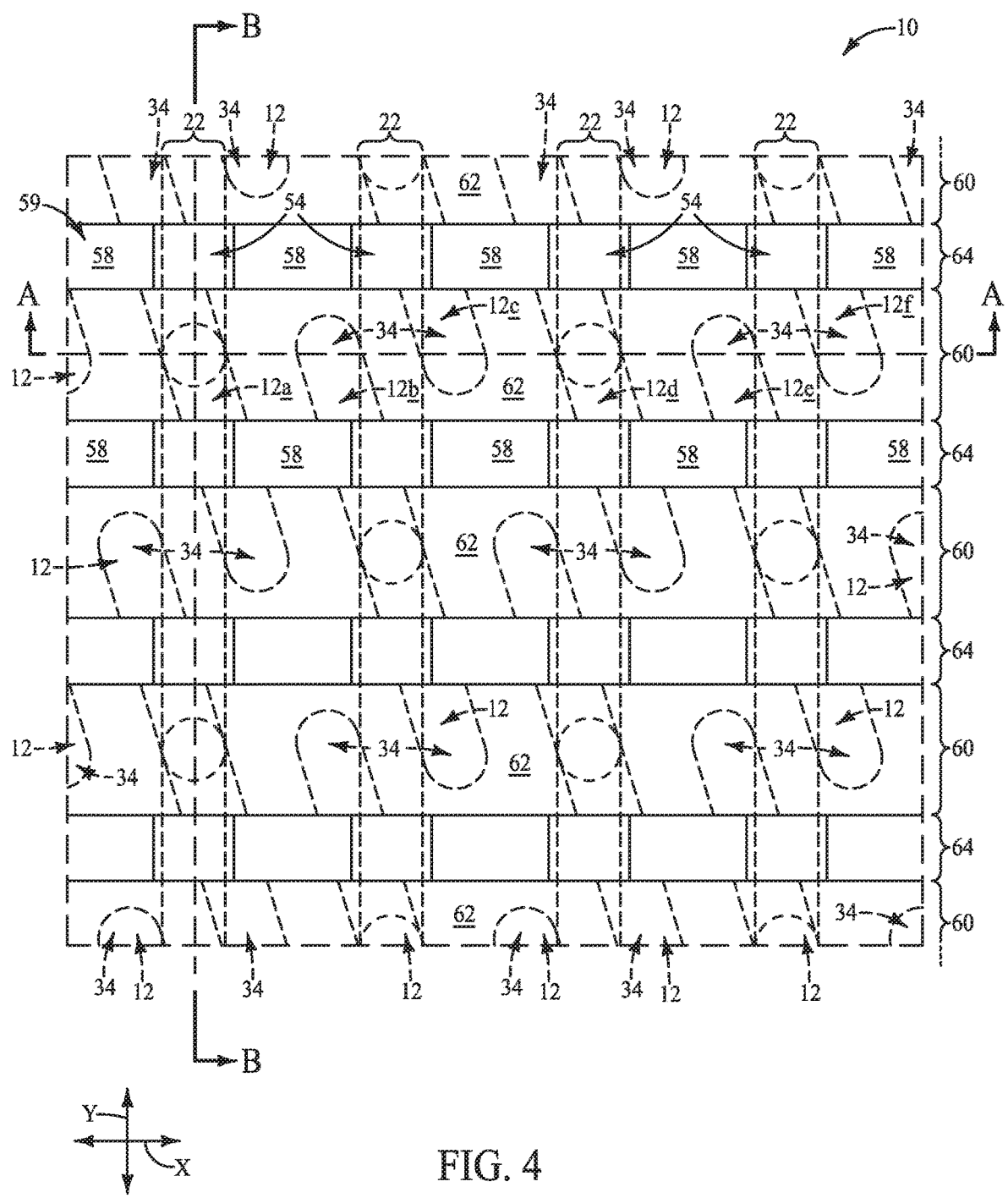
FIGS. 4-4B are diagrammatic views of the regions of the example construction of FIGS. 1-1C at an example process stage following that of FIGS. 3-3B.
Figure 4A:
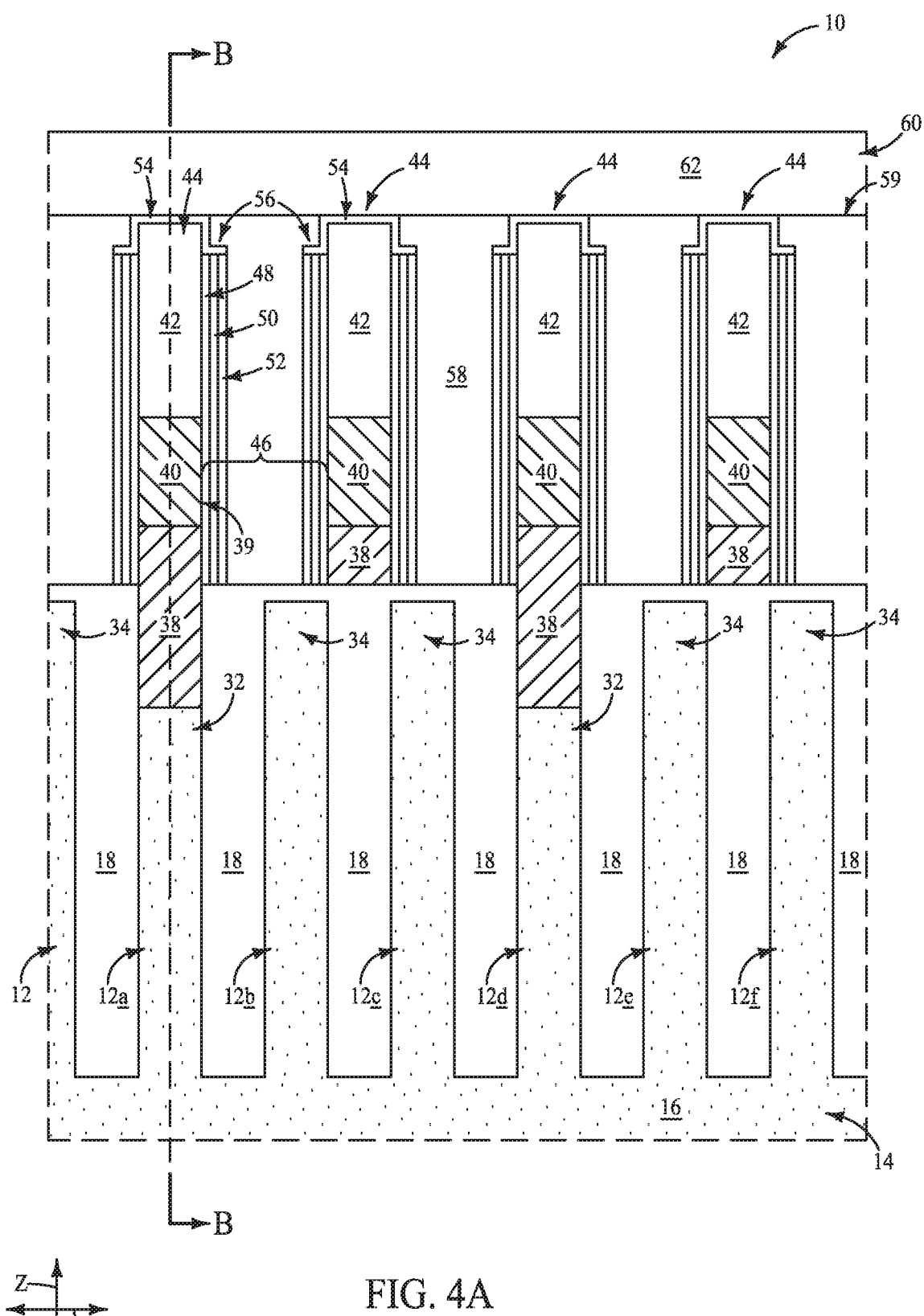
Figure 4B:
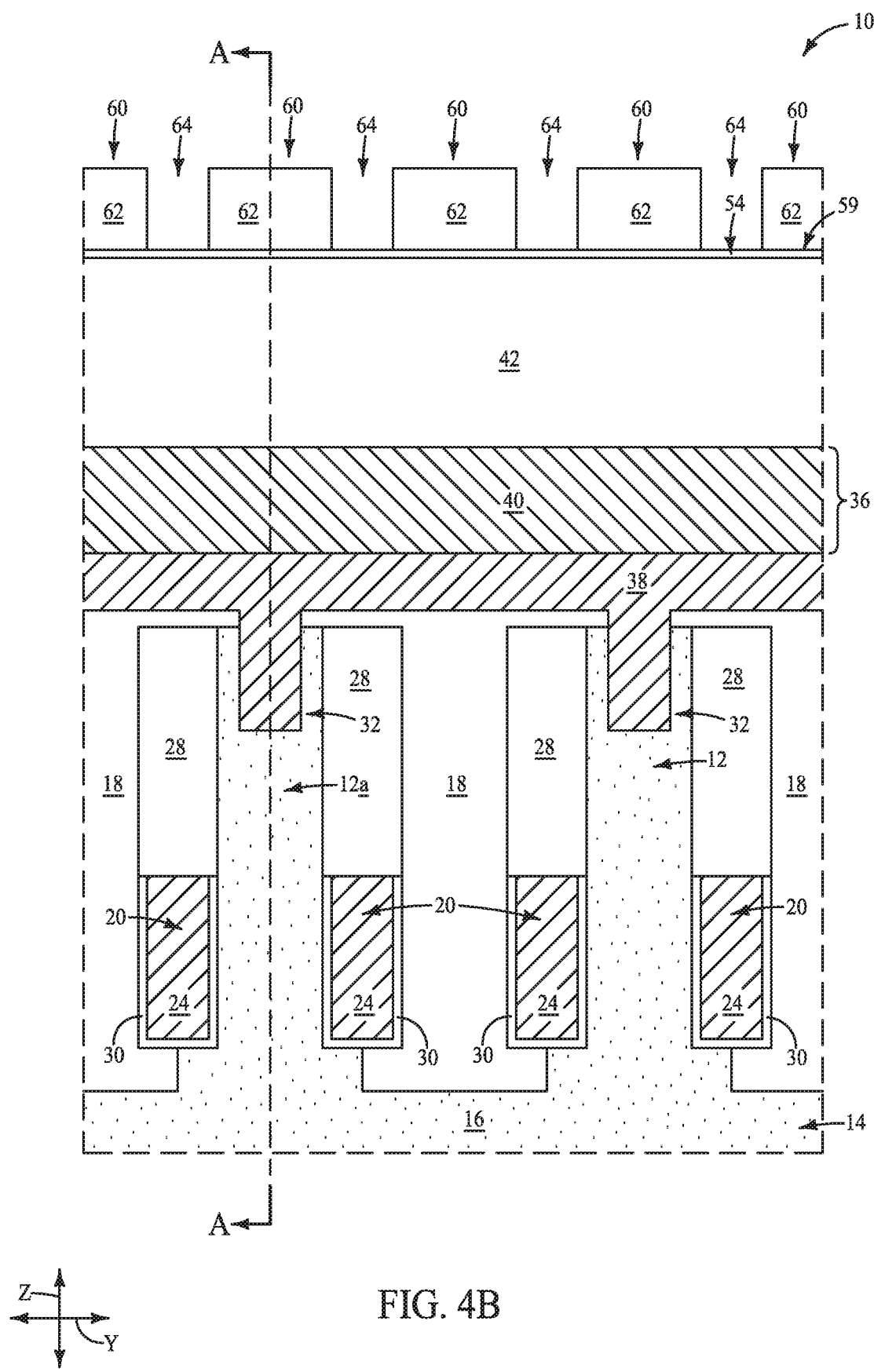

Referring to FIGS. 4-4B, masking structures 60 are formed over the planarized surface 59. The masking structures 60 comprise a masking material 62. The masking material 62 may comprise any suitable composition(s); and in some embodiments may comprise photolithographically-patterned photoresist.

The masking structures 60 are configured as linear structures extending along the x-axis direction. The masking structures are spaced from one another by gaps 64. Portions of the planarized surface 59 are exposed within the gaps 64. The exposed portions of the planarized surface 59 include regions of the insulative caps 54 and regions of the sacrificial material 58.

Figure 5:
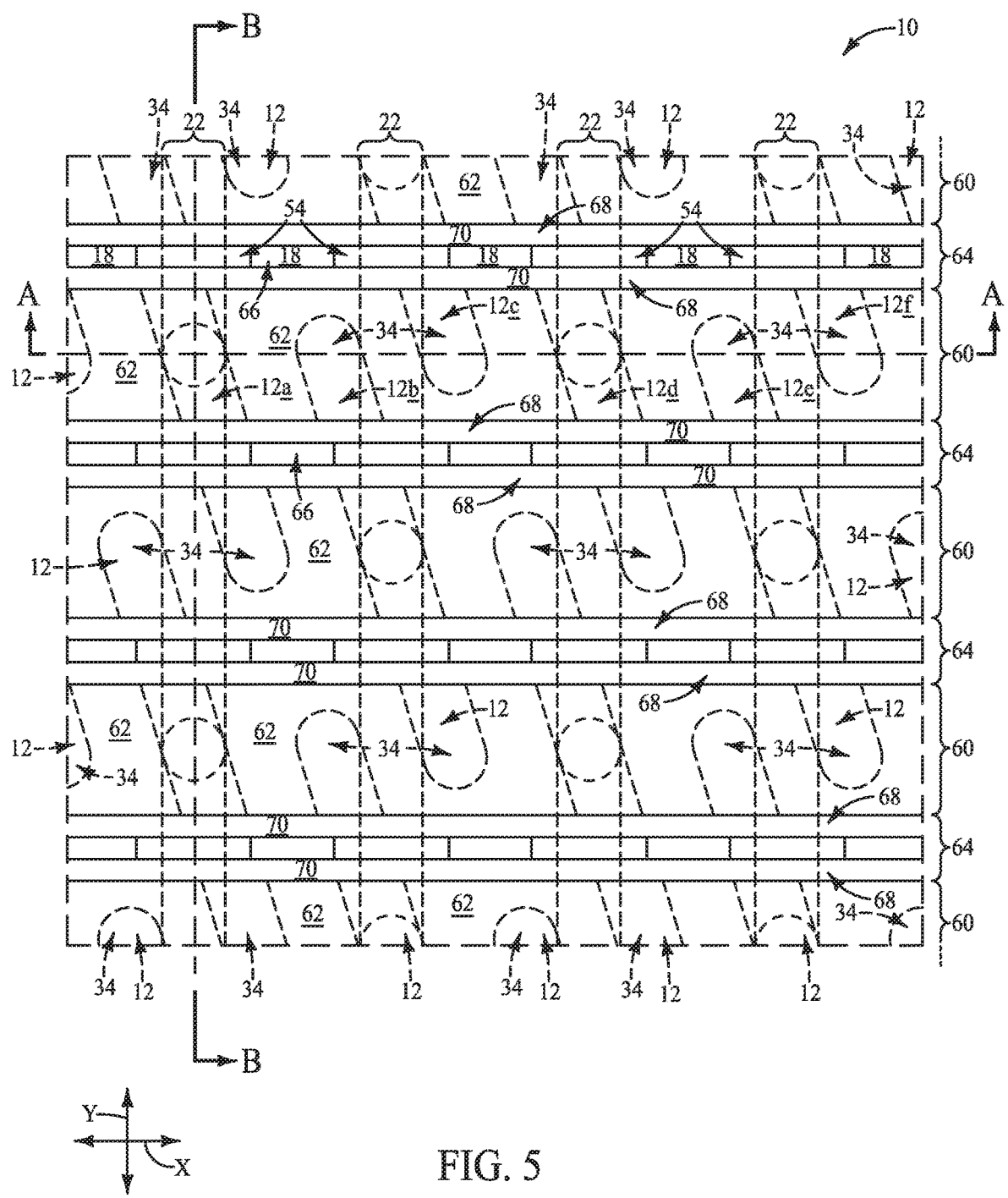
FIGS. 5-5B are diagrammatic views of the regions of the example construction of FIGS. 1-1C at an example process stage following that of FIGS. 4-4B.
Figure 5A:
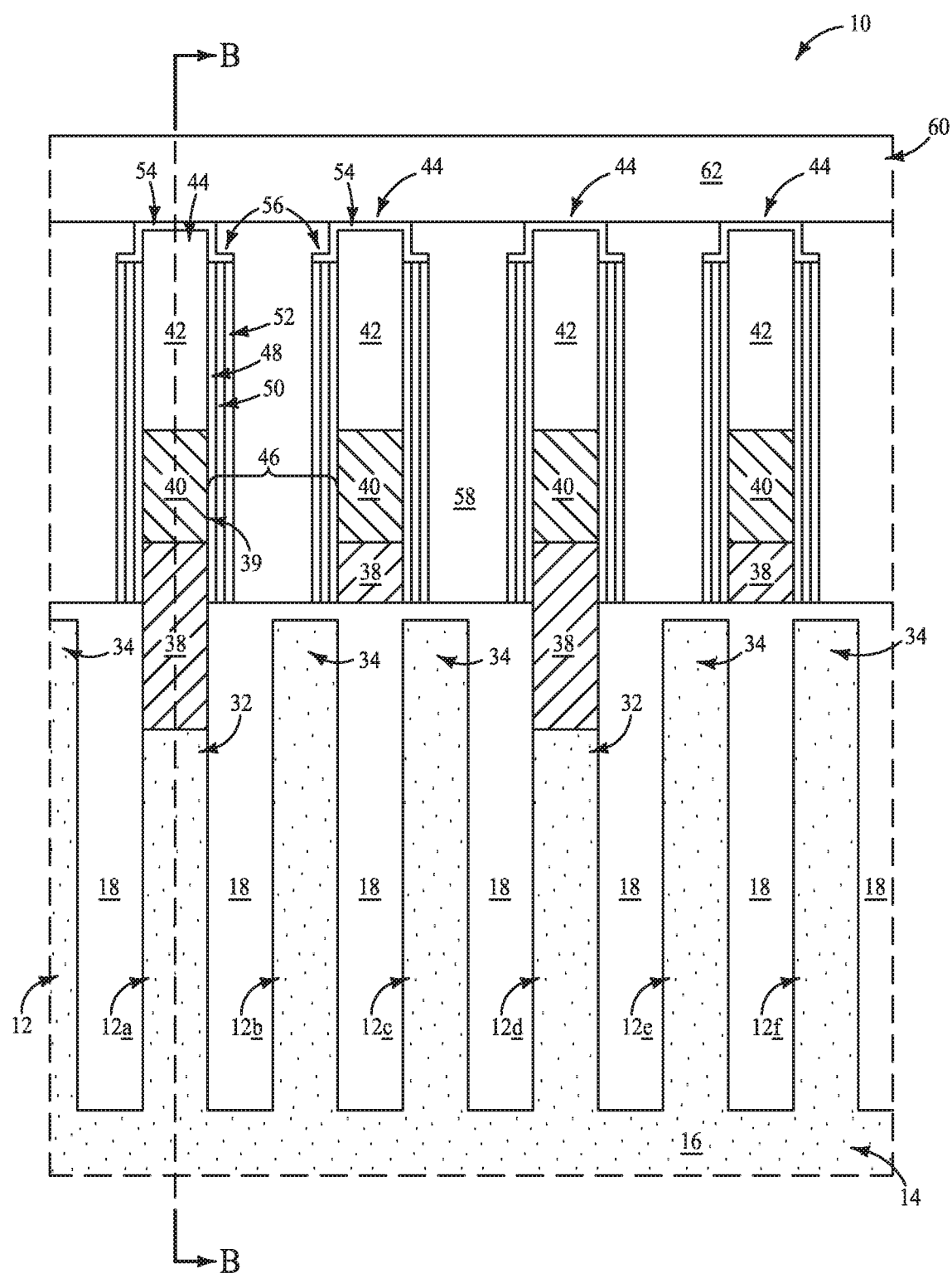
Figure 5B:
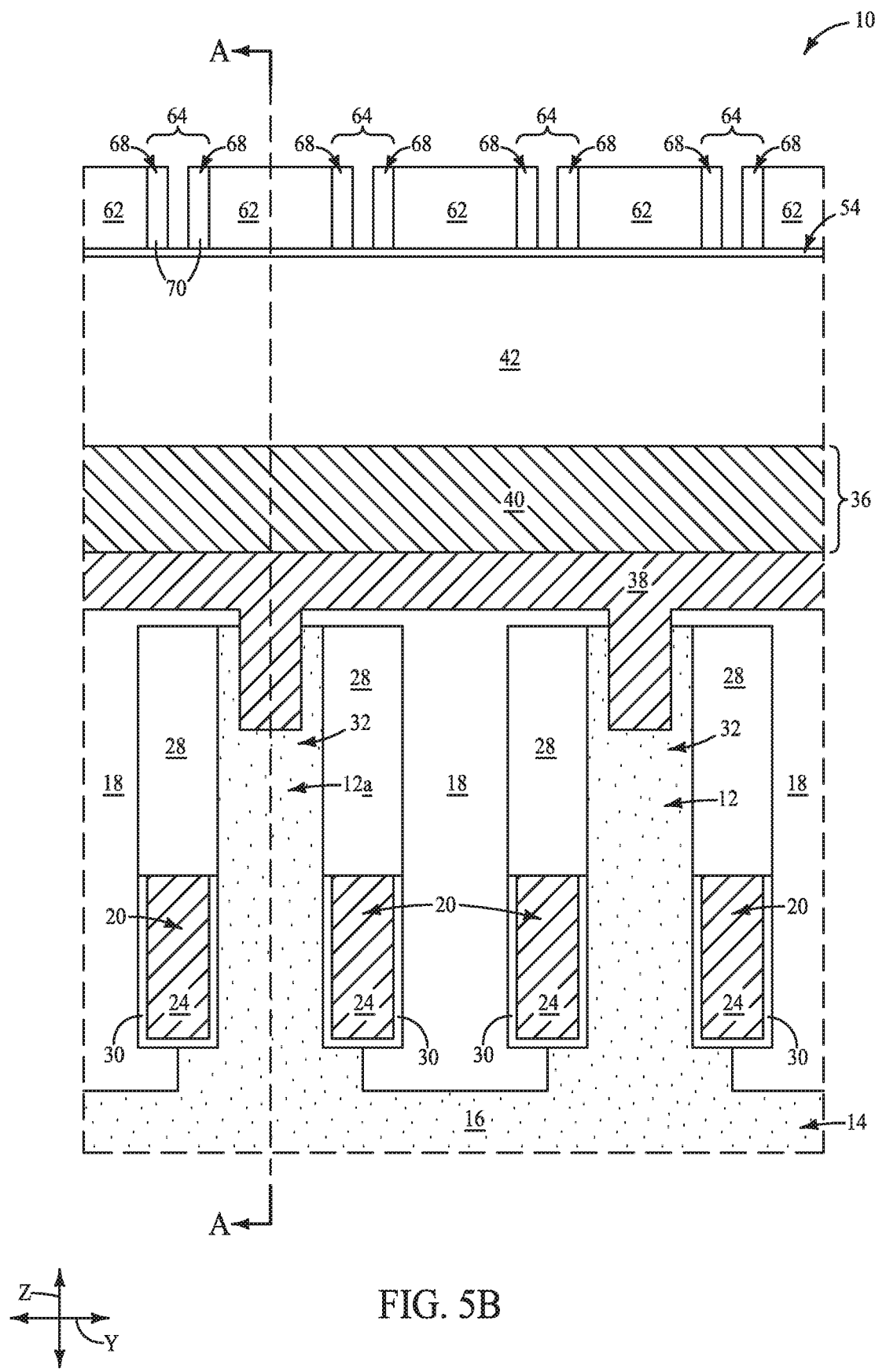

Referring to FIGS. 5-5B, the exposed regions of the sacrificial material 58 are removed to form openings 66 which extend to the insulative material 18. Subsequently, the openings are lined with sacrificial spacers 68. The spacers comprise spacer material 70. The spacer material 70 may comprise any suitable composition(s); and in some embodiments may comprise, consist essentially of, or consist of silicon dioxide.

In the illustrated embodiment, the spacers 68 extend across the insulative caps 54 within the gaps 64. In other embodiments, the spacers may not extend across such insulative caps.

Figure 6:
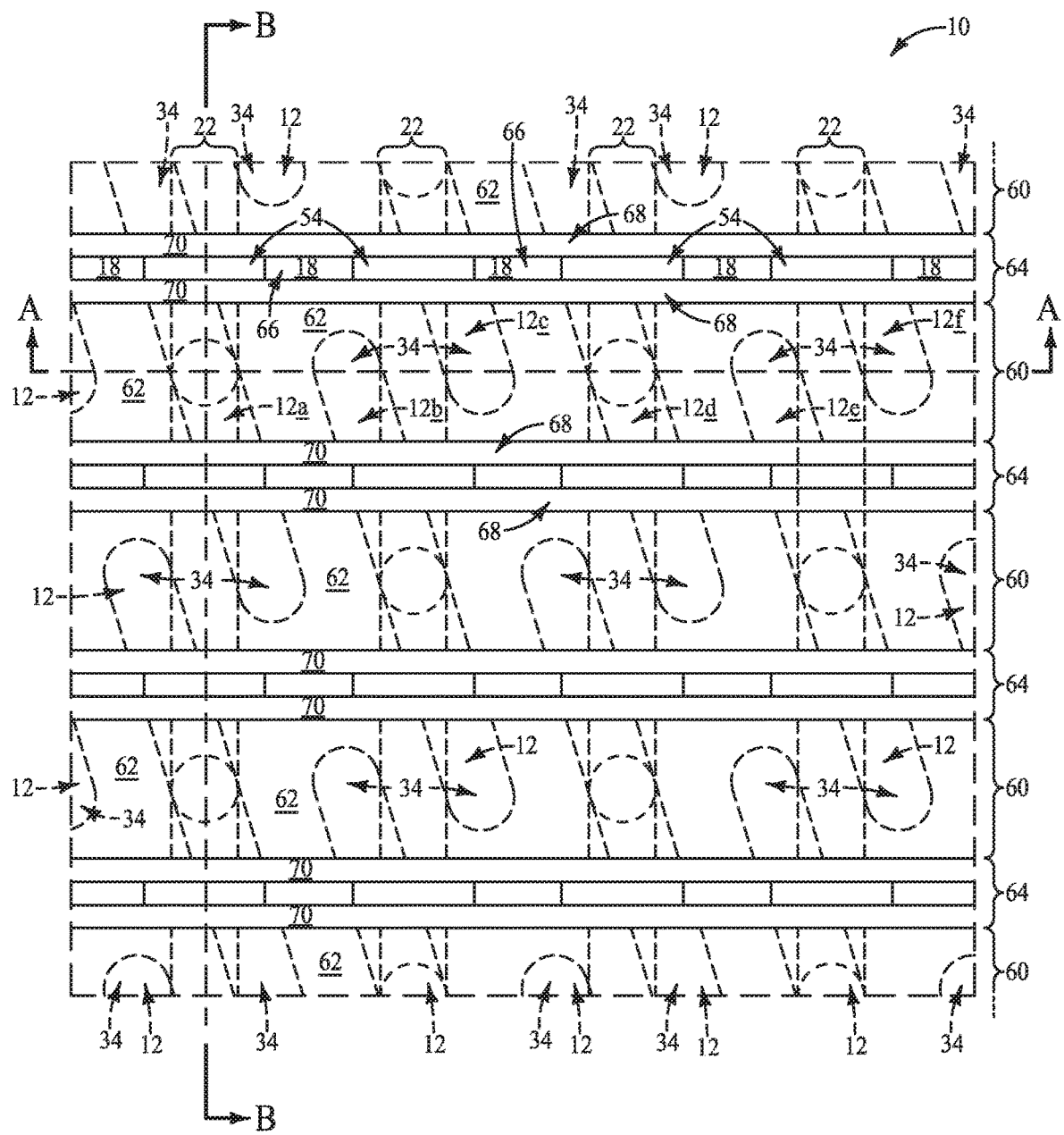
FIGS. 6-6C are diagrammatic views of the regions of the example construction of FIGS. 1-1C at an example process stage following that of FIGS. 5-5B.
Figure 6A:
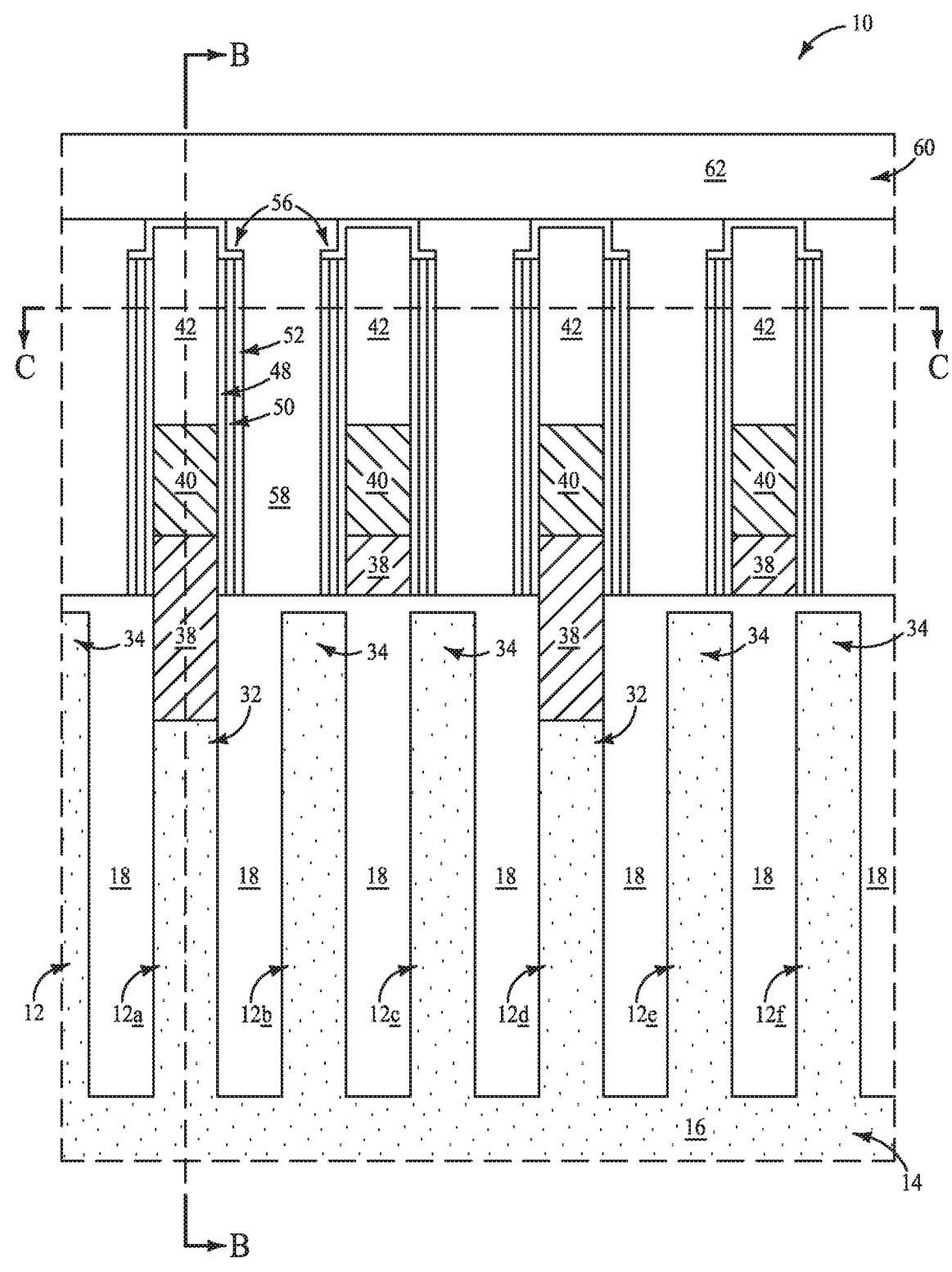
FIGS. 6A and 6B are diagrammatic cross-sectional side views along the lines A-A and B-B, respectively, of FIGS. 6 and 6C.
Figure 6B:
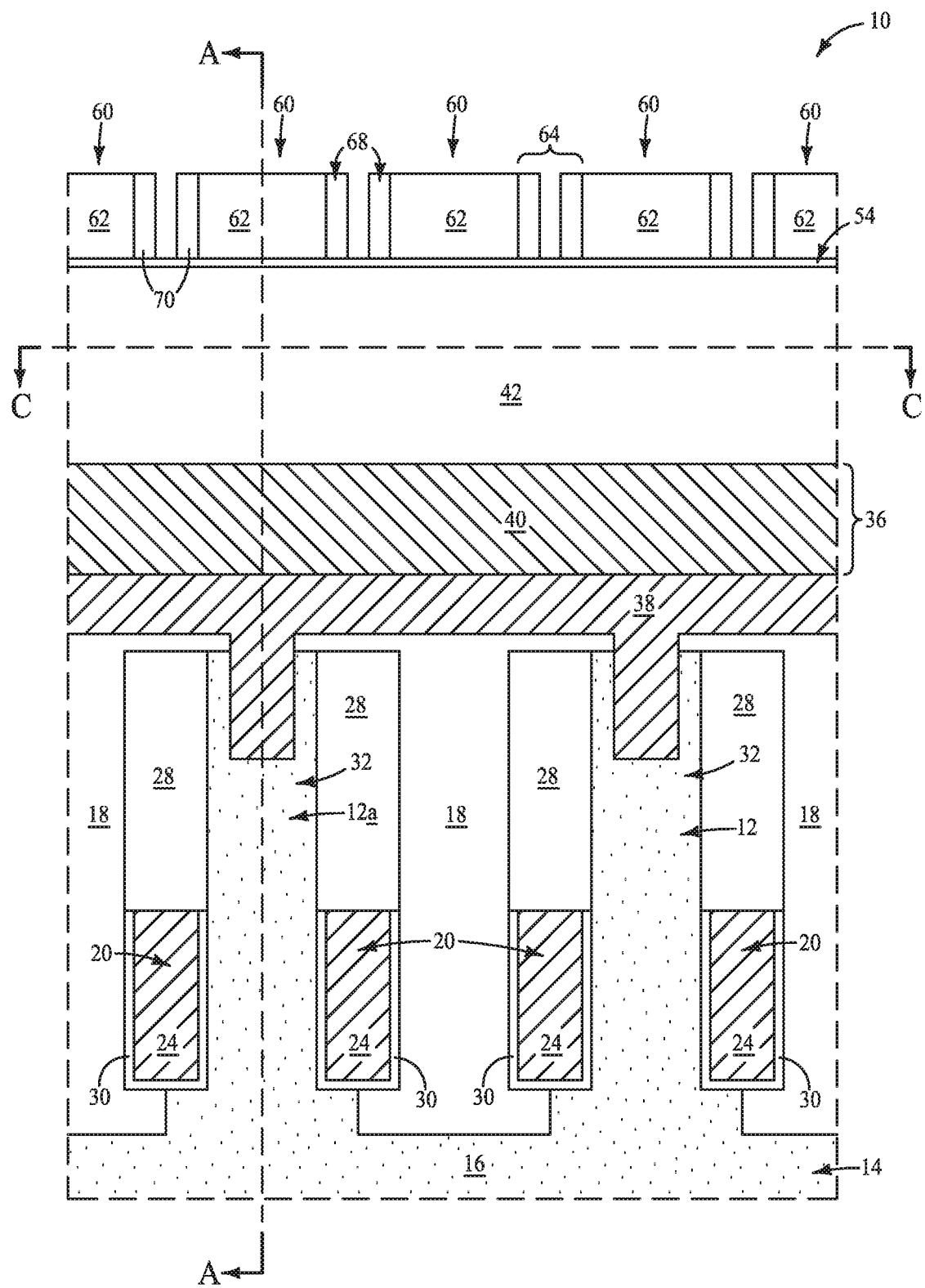
Figure 6C:
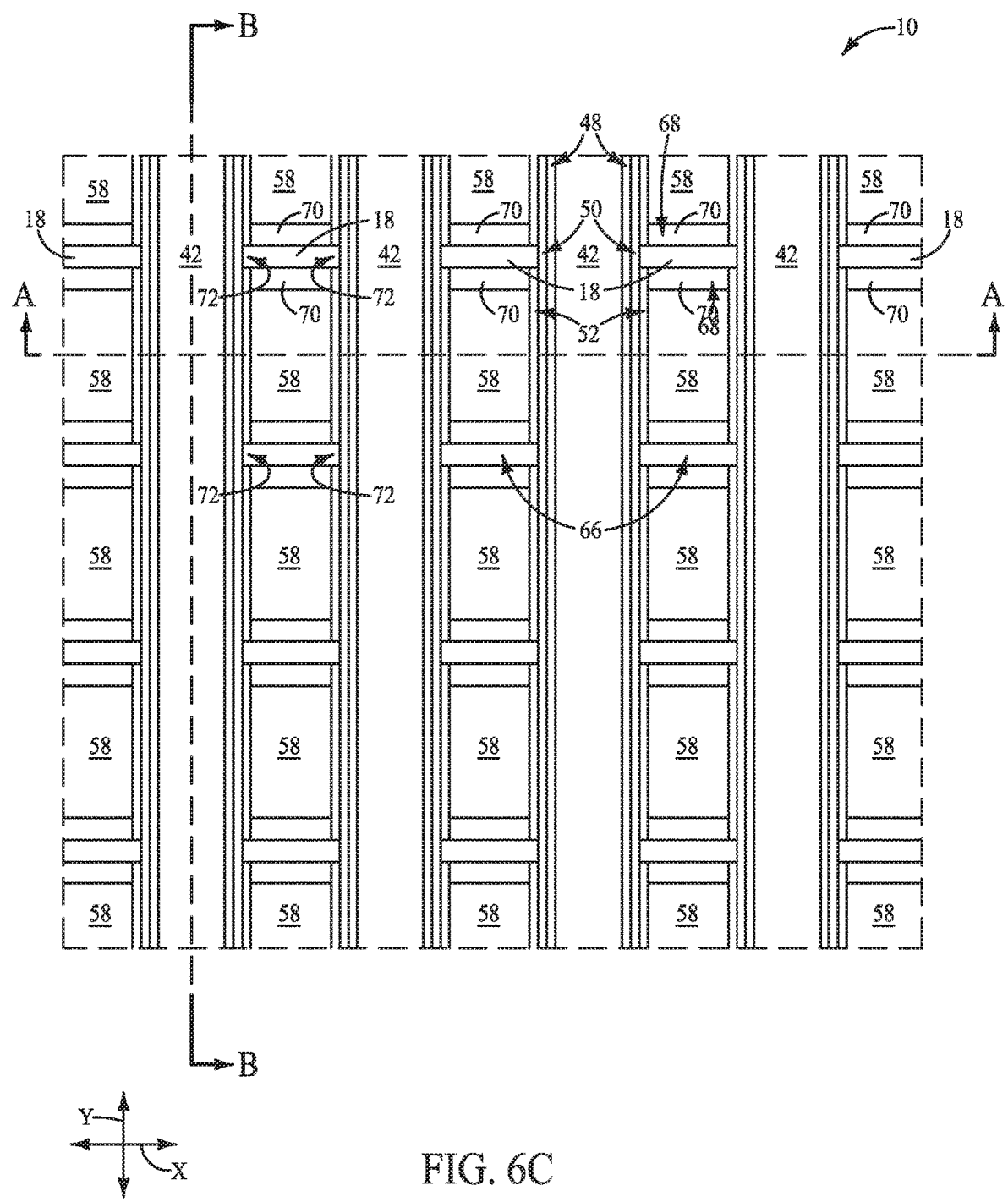

Referring to FIGS. 6-6C, openings 72 are etched through sides of the outer panels 48 (as shown in FIG. 6C). Such may be considered to extend the openings 66 through regions of the outer panels 48.

The openings 72 may be formed with an etch selective for the material of the outer panels 48 relative to the material 70 of the spacers 68. In some embodiments, the outer panels 48 comprise a different composition than the insulative caps 54, and accordingly the etch may also be selective for the outer panels 48 relative to the insulative caps 54. In other embodiments (described below with reference to FIG. 7), the insulative caps 54 may be formed to be thicker than the outer panels 48 so that even if the insulative caps comprise a same composition as the outer panels, the etch will penetrate the outer panels before penetrating downwardly through the insulative caps.

The openings 72 expose portions of the film 50. Notably, the etching utilized to expose the portions of the film is conducted in regions distal from the above-described cross-section along the line A-A (as can be understood with reference to FIG. 6C which shows the openings 72 in regions distal from the line A-A). Accordingly, the above-described configuration along the cross-section of A-A is retained (as shown in FIG. 6A) such that region of the assembly 10 along such cross-section has the rails 56 remaining in a configuration which includes the film 50 between the inner and outer panels 48 and 52.

The active areas 12 (FIG. 6) are not shown in FIG. 6C to simplify the drawing.

Figure 7:
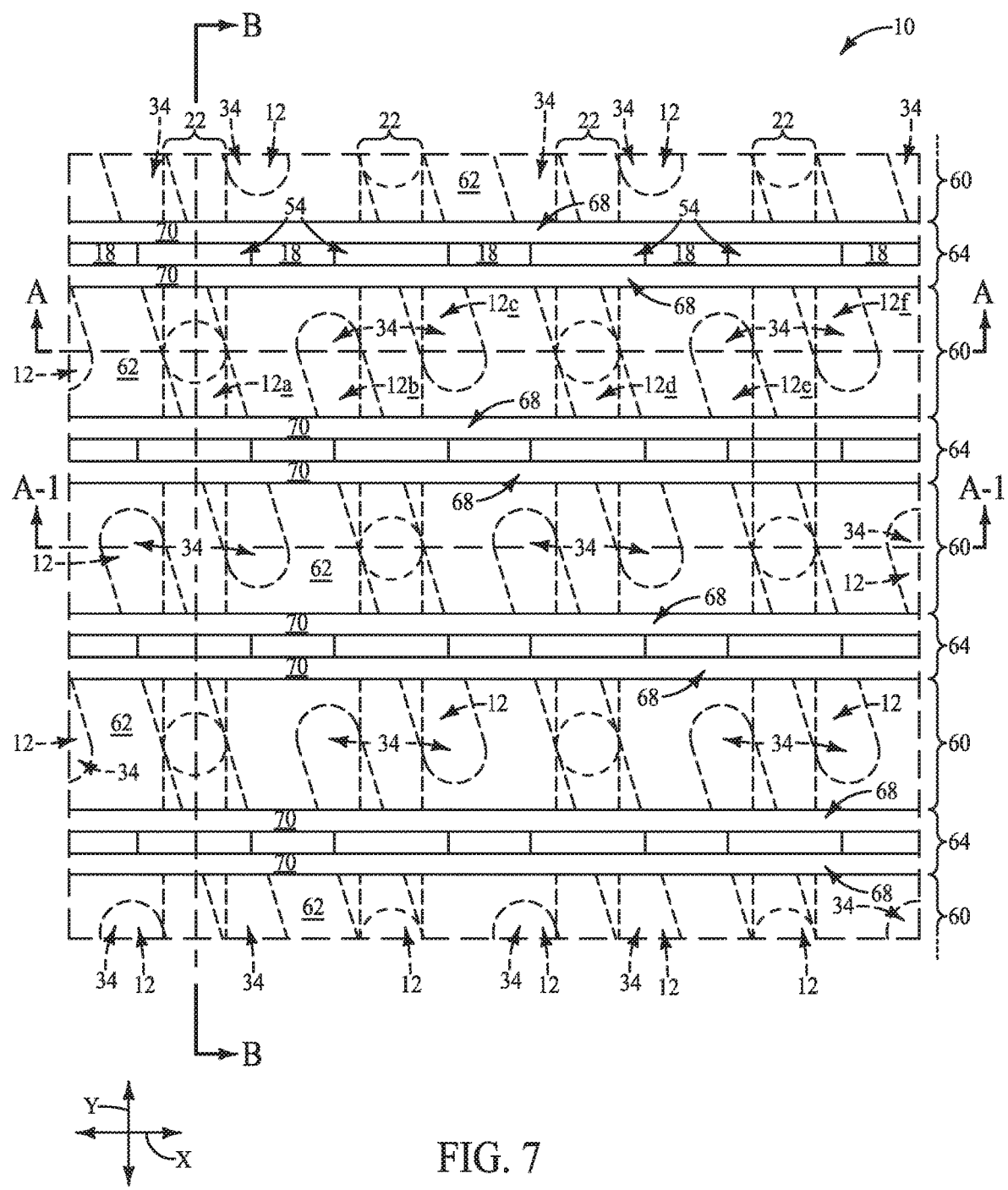
Figure 7A:
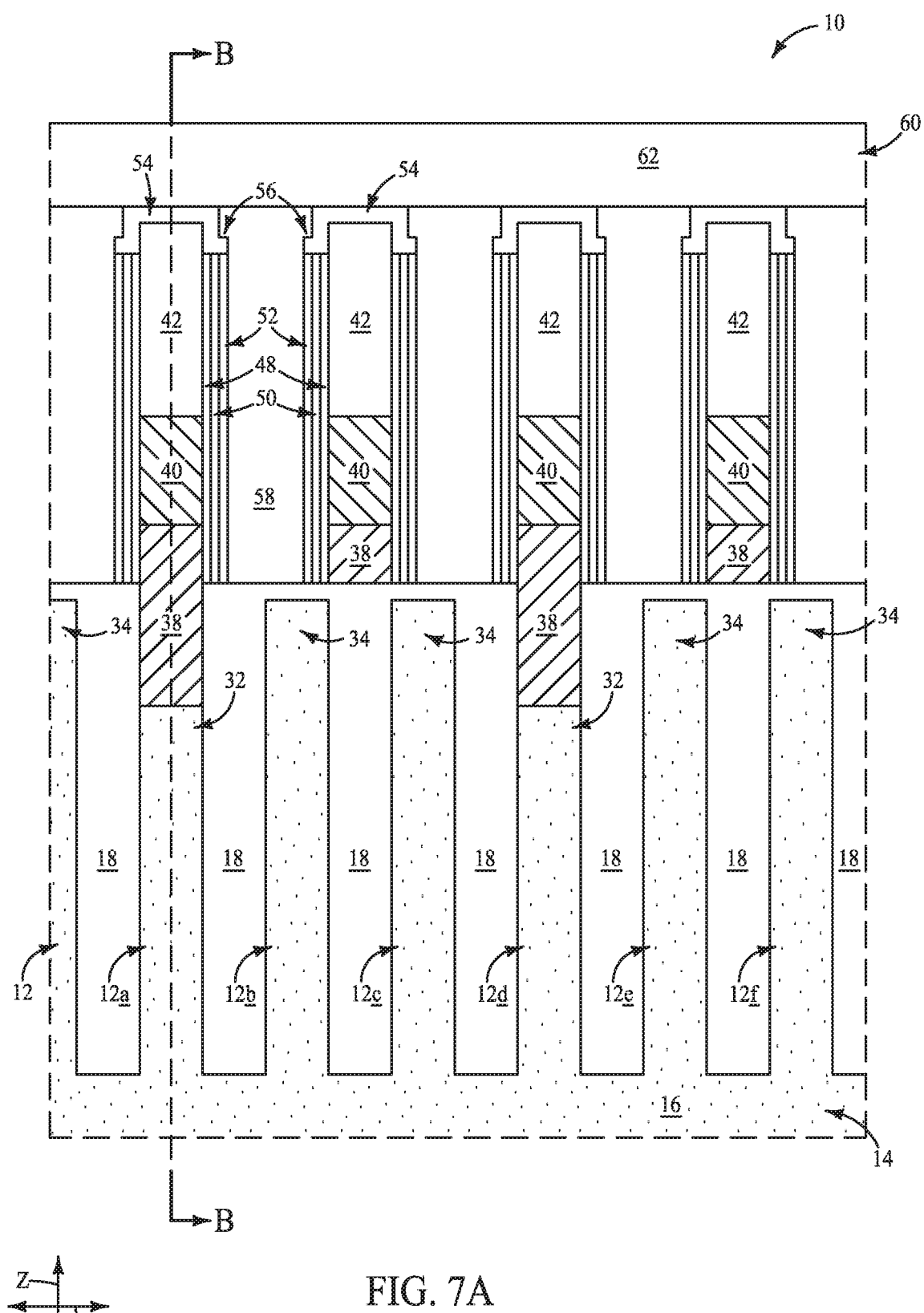
Figure 7A:
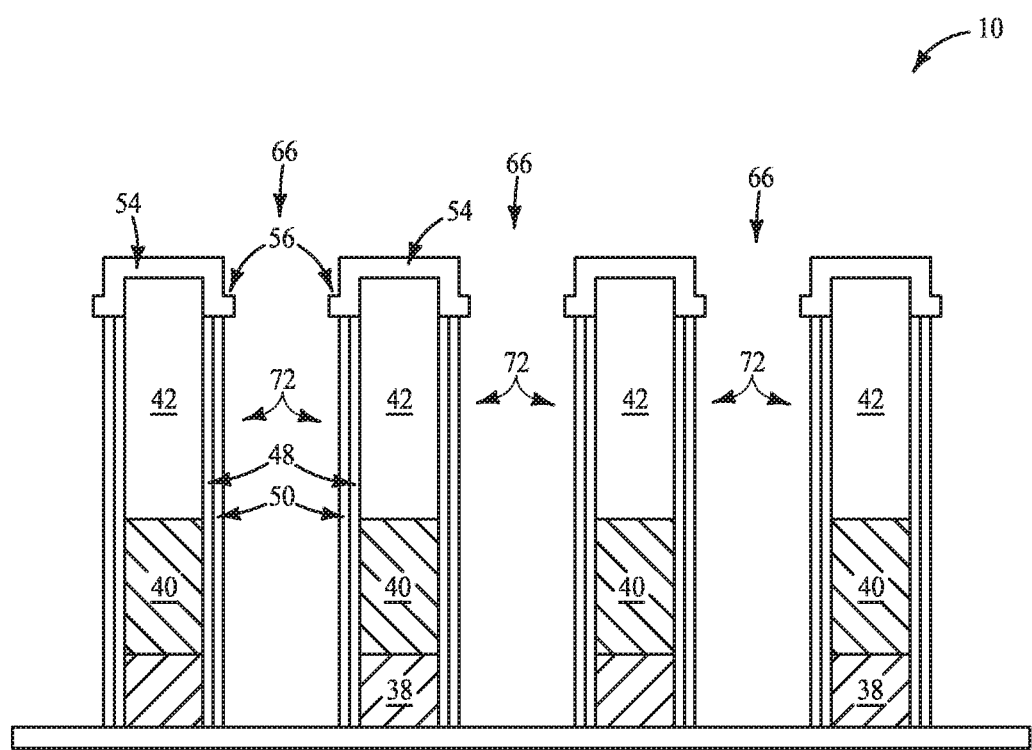
Figure 1:
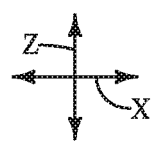

FIGS. 7, 7A and 7A-1 show the assembly 10 at the same process stage as described above with reference to FIGS. 6-6C. However, the insulative caps 54 are shown to be formed to thicker than the outer panels 52 which may enable the outer panels 52 to be removed while leaving the insulative caps 54 over the remaining portions of the film 50 and the inner panels 48, even in configurations in which the insulative caps 54 and outer panels 52 comprise a same composition as one another. FIG. 7A-1 shows a cross-section along the line A-1-A-1 of FIG. 7, and shows the openings 72 etched through the outer panels 52 (shown in FIG. 7A).

Figure 8:
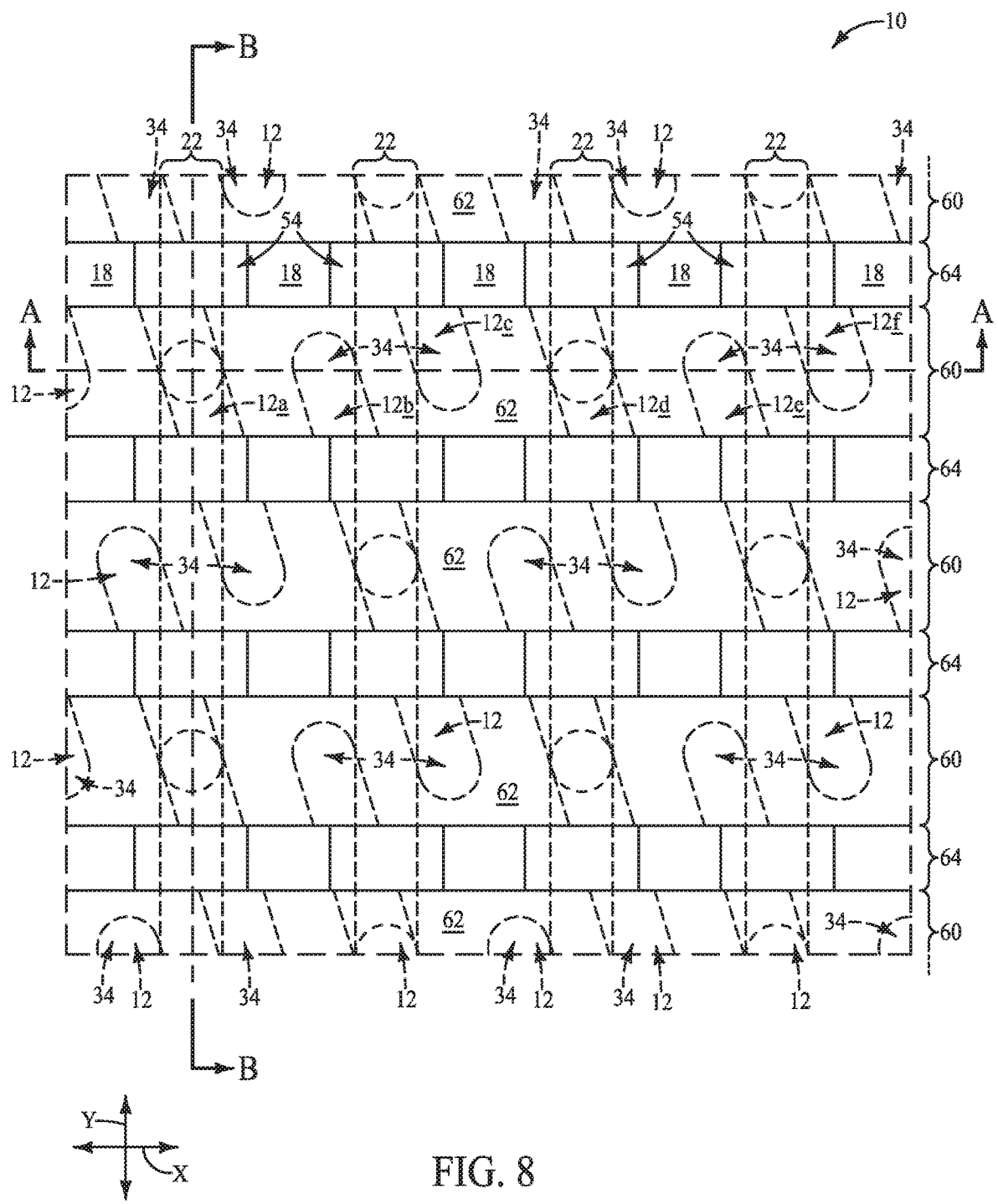
FIGS. 8-8C are diagrammatic views of the regions of the example construction of FIGS. 1-1C at an example process stage following that of FIGS. 6-6C.
Figure 8A:
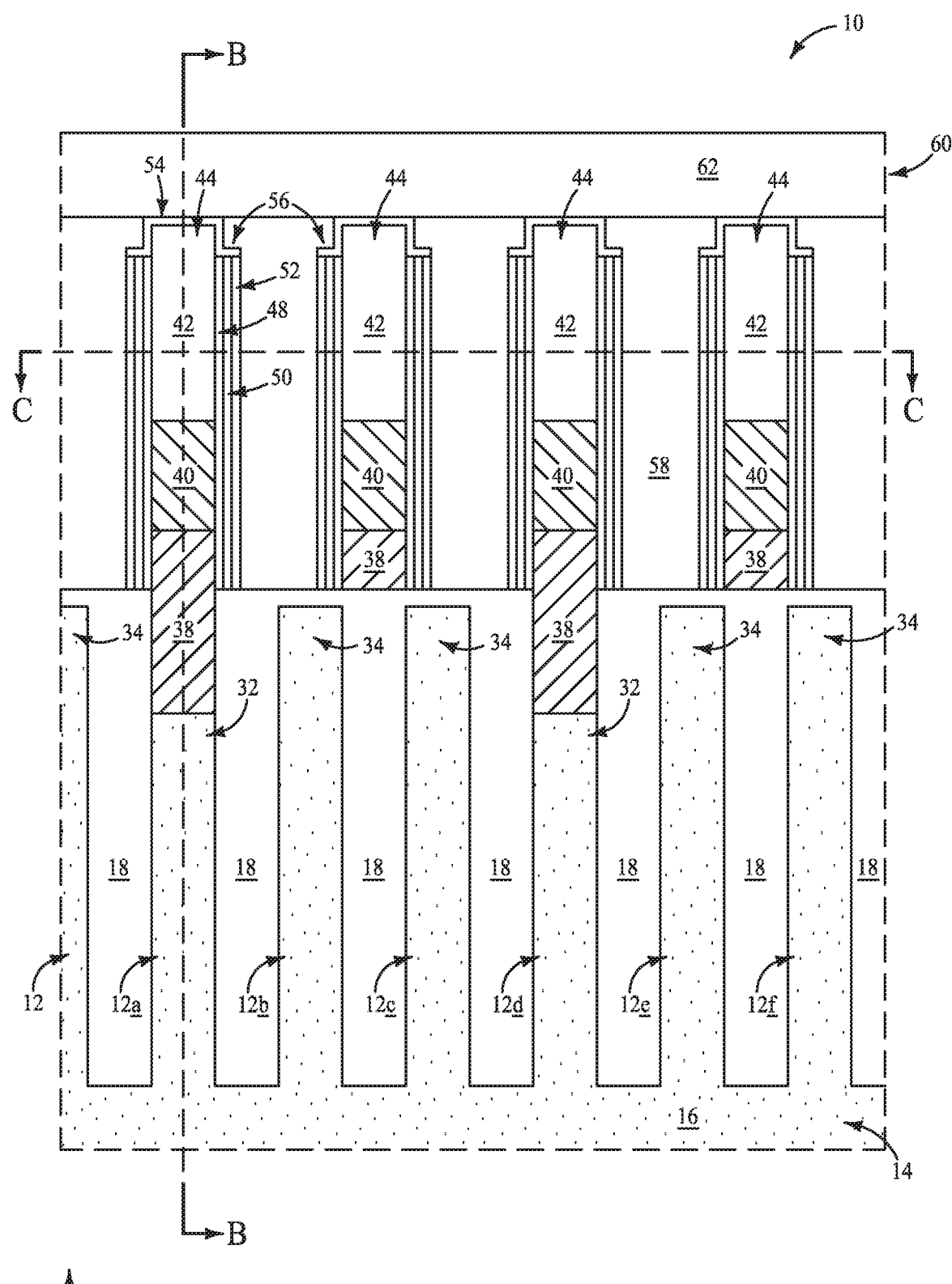
FIGS. 8A and 8B are diagrammatic cross-sectional side views along the lines A-A and B-B, respectively, of FIGS. 8 and 8C.
Figure 8B:
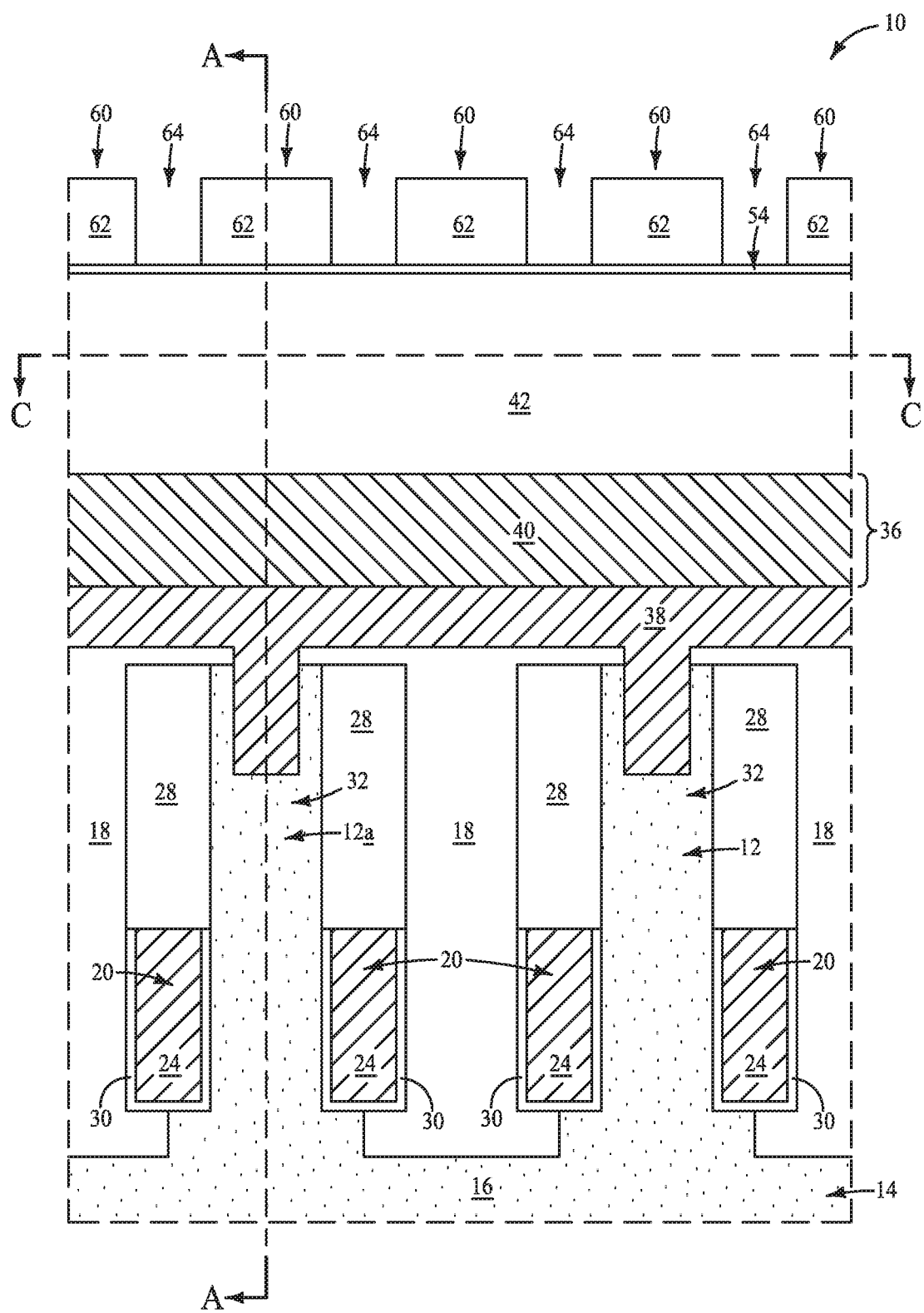
Figure 8C:
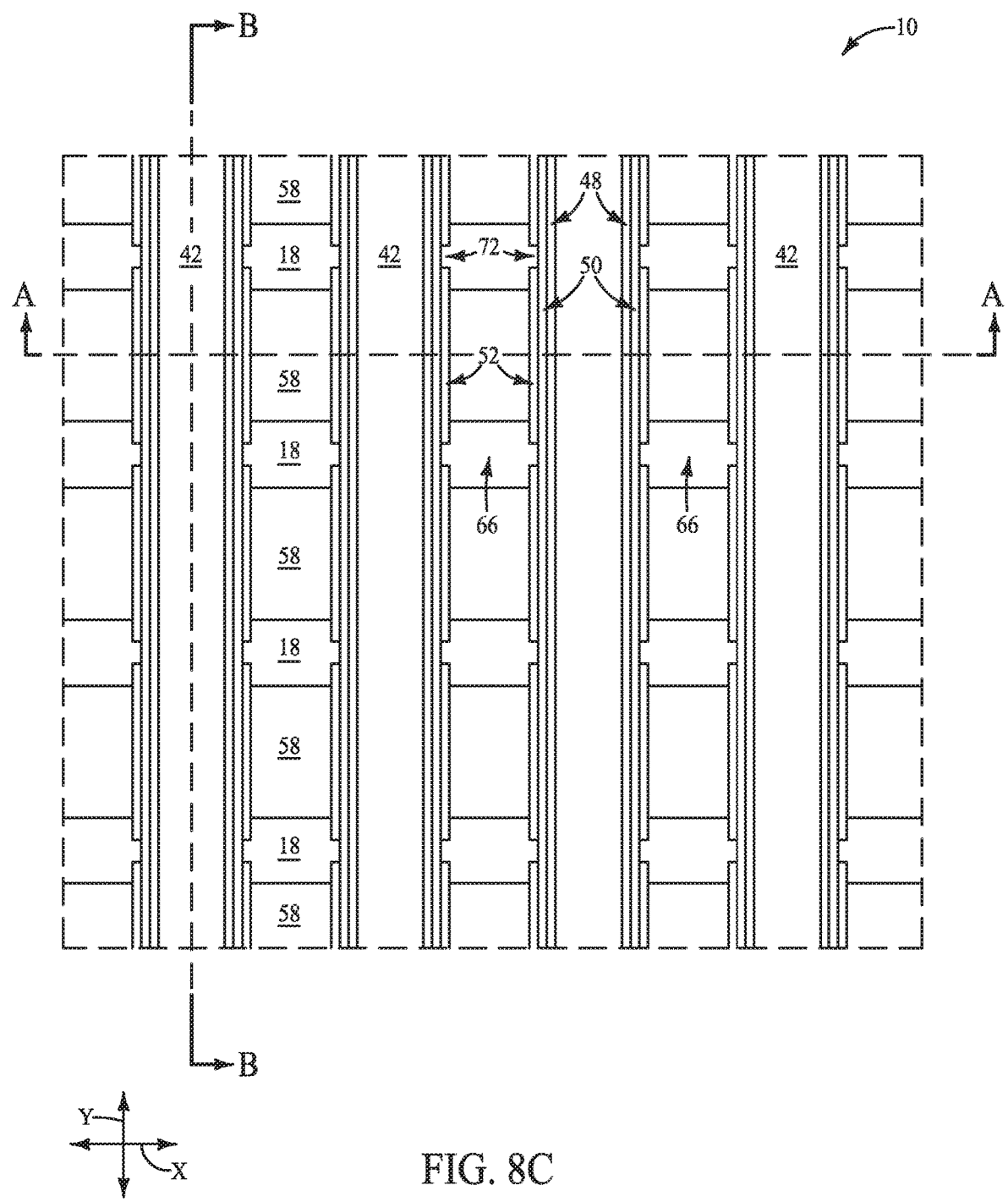

Referring to FIGS. 8-8C, the assembly 10 is shown at a processing stage subsequent to that of FIGS. 6-6C. The spacers 68 (FIGS. 6-6C) are removed with an etch selective for such spacers relative to the insulative caps 54, the panels 48 and the upper surface of the underlying insulative material 18. In some embodiments, the spacers 68 may comprise silicon dioxide; and the insulative caps 54, panels 48 and upper surface of the underlying insulative material 18 may all comprise silicon nitride. In the illustrated embodiment, the film 50 is not etched during the removal of the spacers 68. In other embodiments, the film 50 may be at least partially etched during the removal of the spacers 68.

Figure 9:
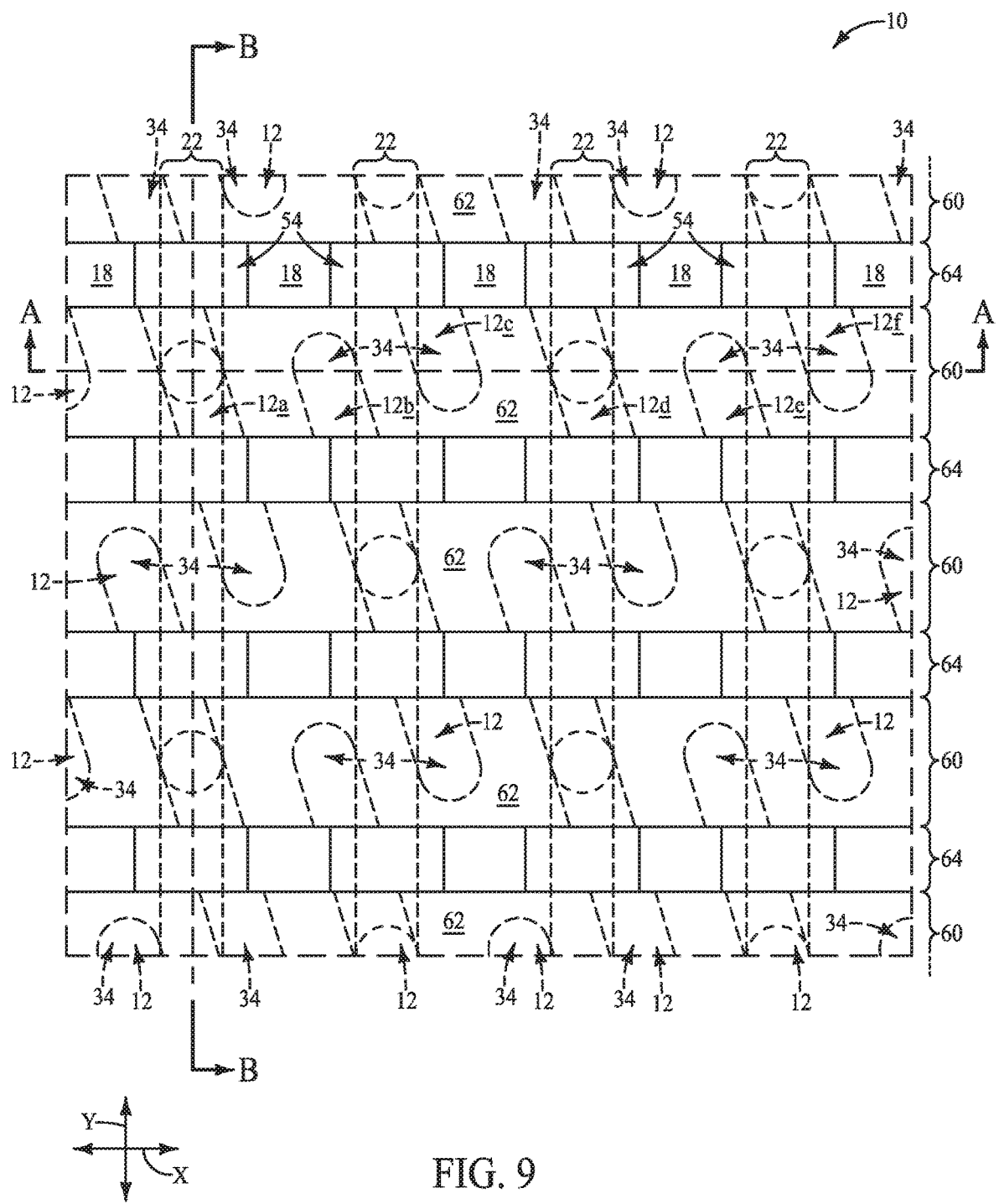
FIGS. 9-9C are diagrammatic views of the regions of the example construction of FIGS. 1-1C at an example process stage following that of FIGS. 8-8C.
Figure 9A:
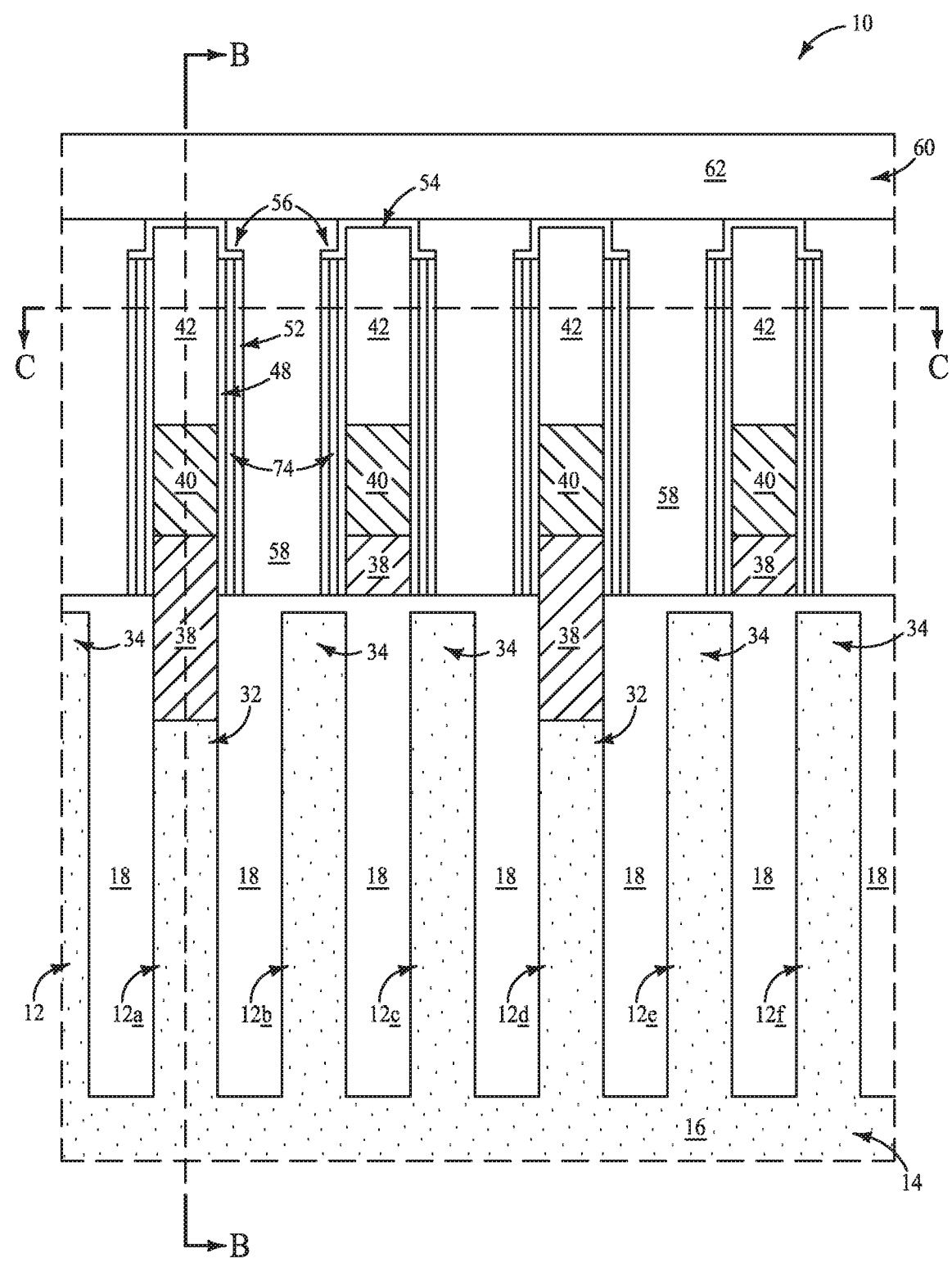
FIGS. 9A and 9B are diagrammatic cross-sectional side views along the lines A-A and B-B, respectively of FIGS. 9 and 9C.
Figure 9B:
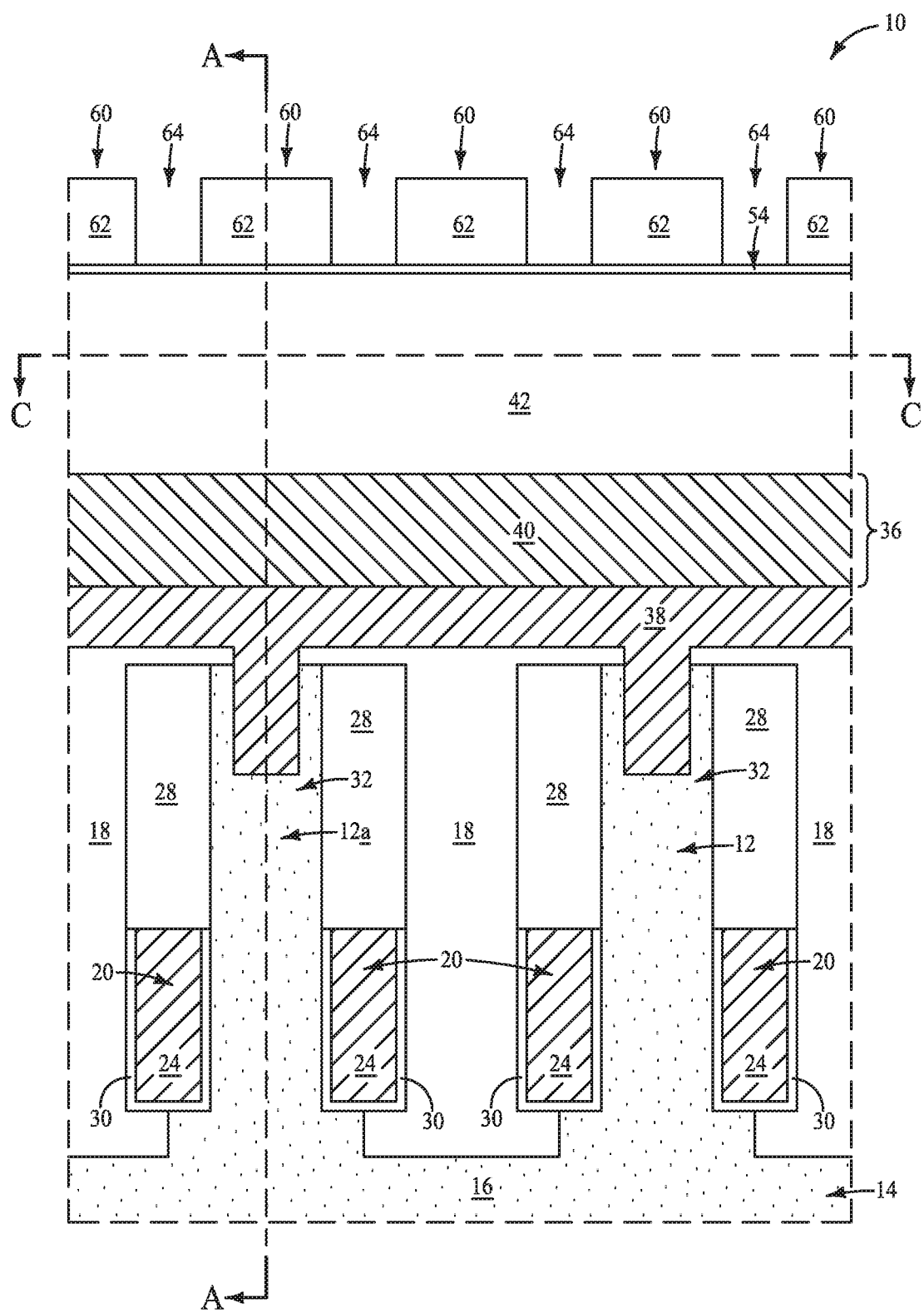
Figure 9C:
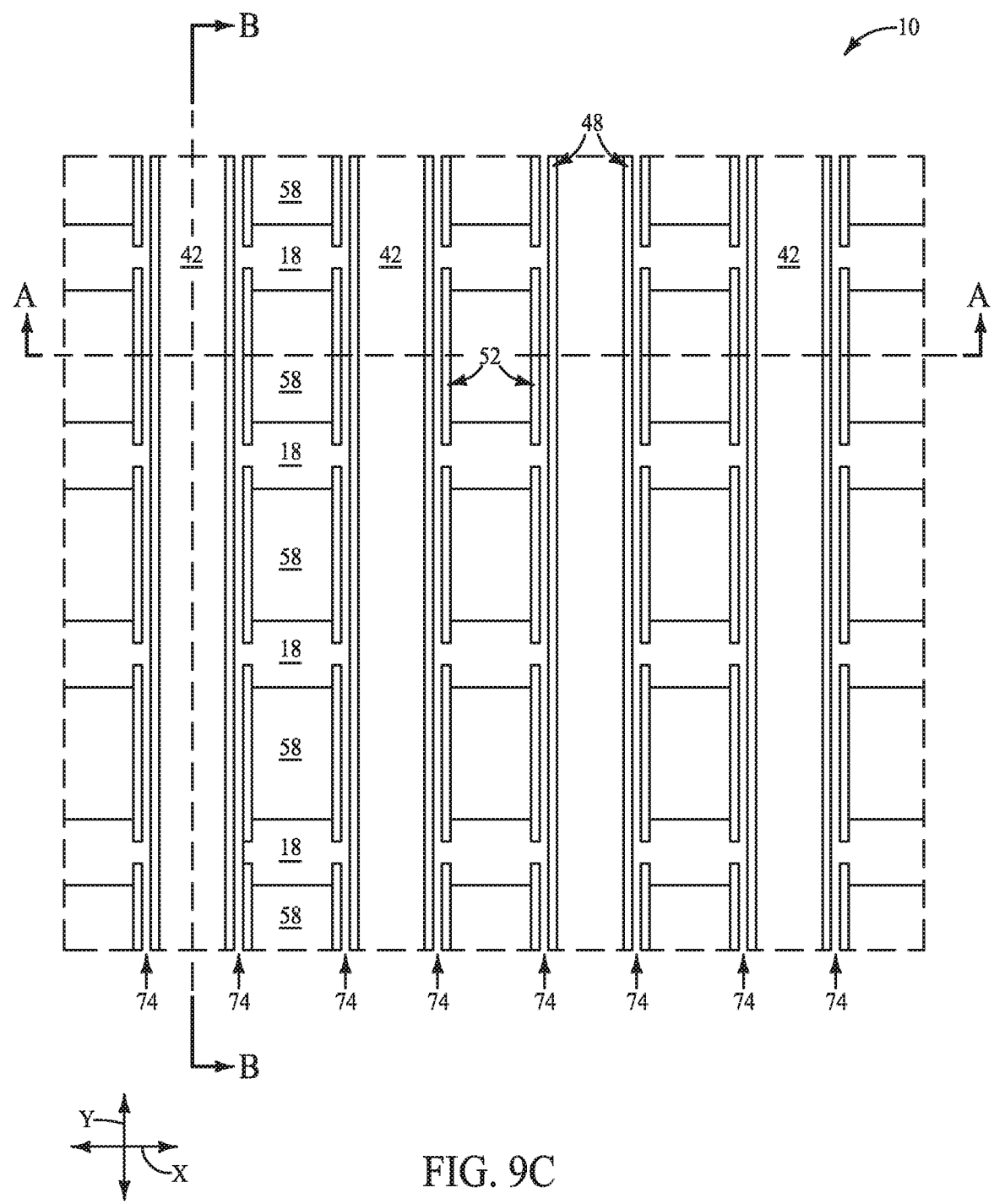

Referring to FIGS. 9-9C, the film 50 (FIGS. 8-8C) is removed to leave voids 74 within the rails 56. In the illustrated embodiment, an entirety of the film 50 is removed. In other embodiments, only some of the film 50 may be removed.

The film 50 may be removed with any suitable processing. In some embodiments, the film 50 comprises a low-k oxide (e.g., porous silicon dioxide, carbon-doped silicon dioxide, etc.) and may be removed with an etch selective for the oxide (silicon dioxide) relative to the nitride (silicon nitride) of the panels 48 and 52, the insulative caps 54, and the upper surface of the insulative material 18.

Figure 10:
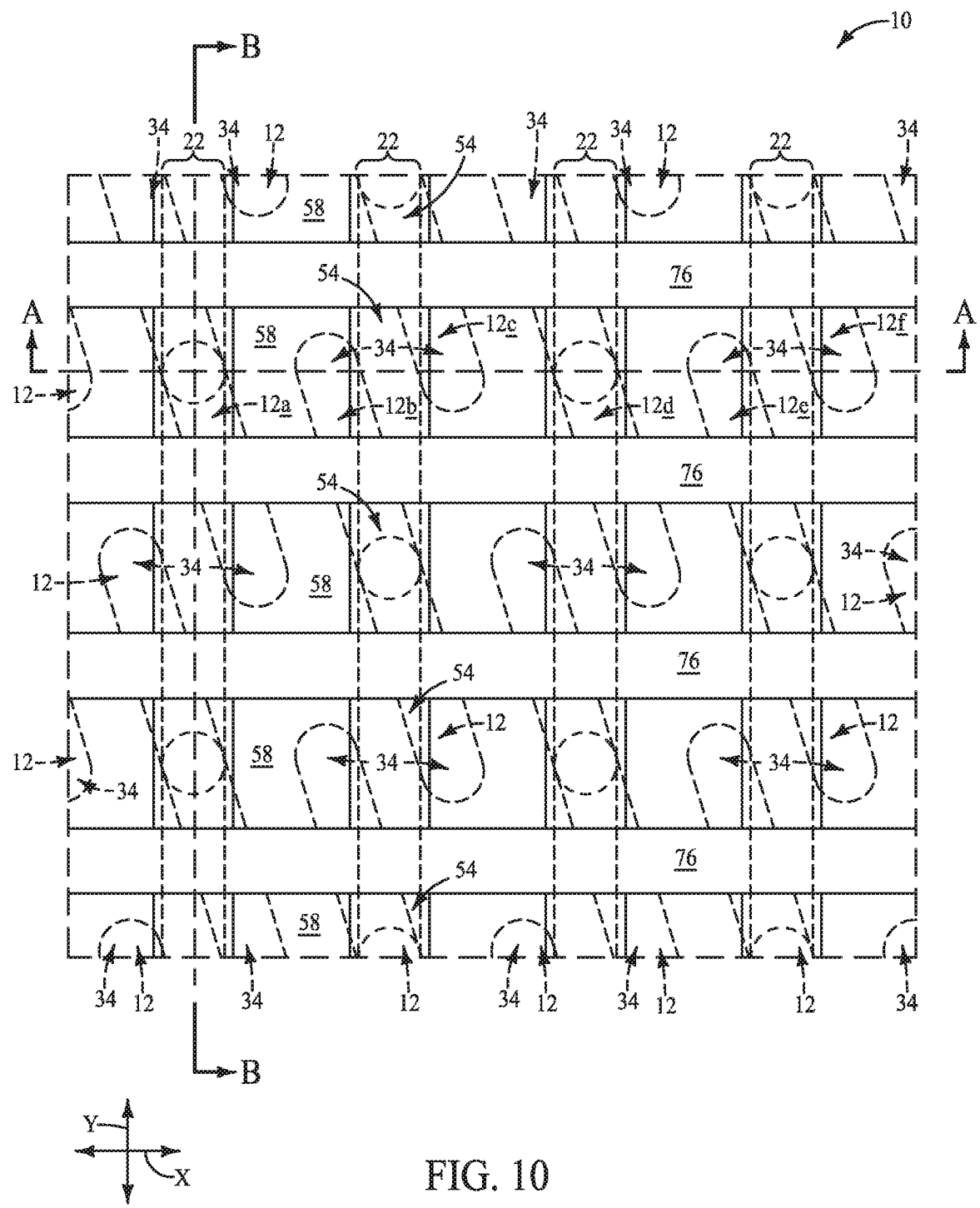
FIGS. 10-10B are diagrammatic views of the regions of the example construction of FIGS. 1-1C at an example process stage following that of FIGS. 9-9C.
Figure 10A:
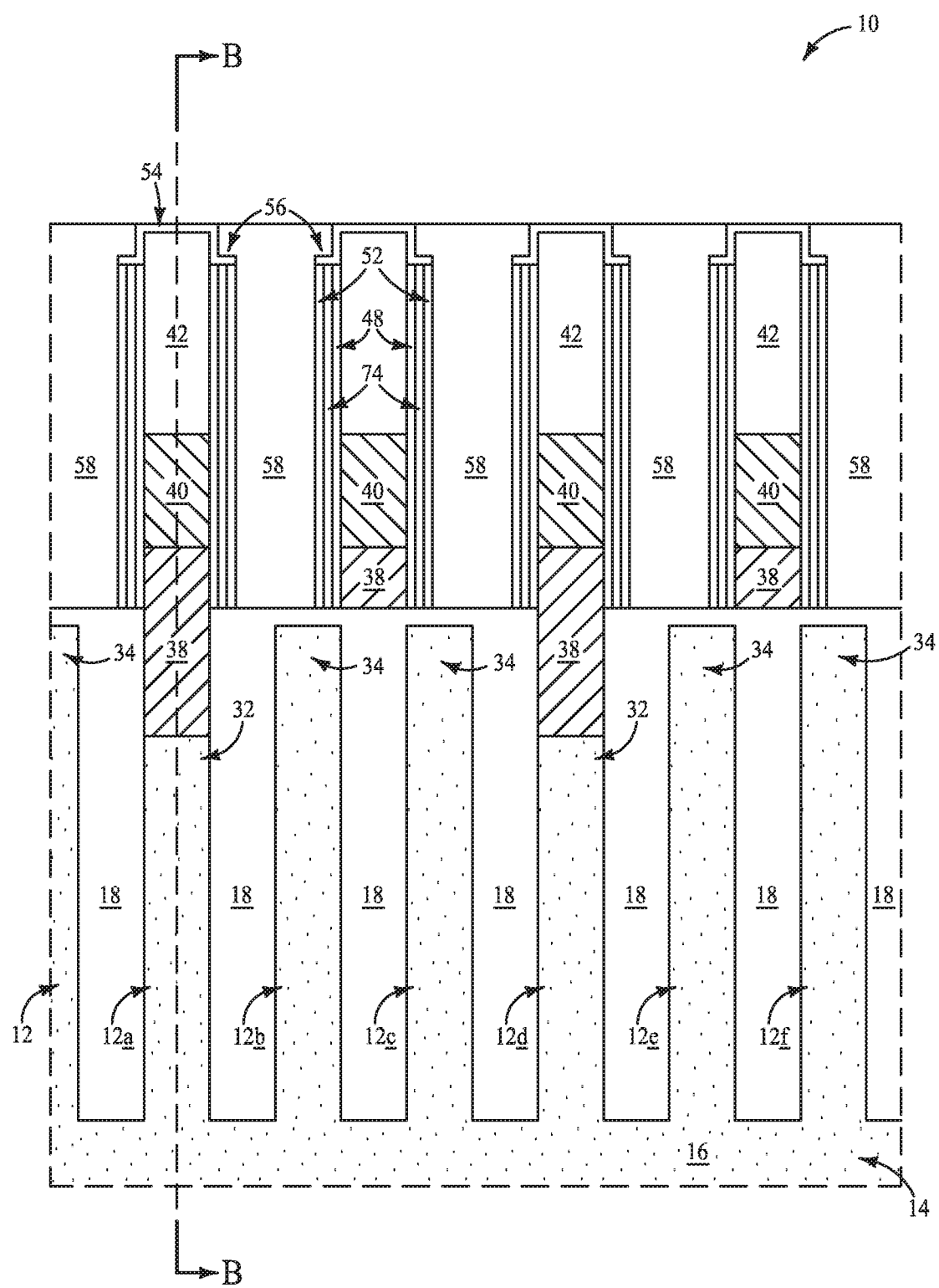
Figure 10B:
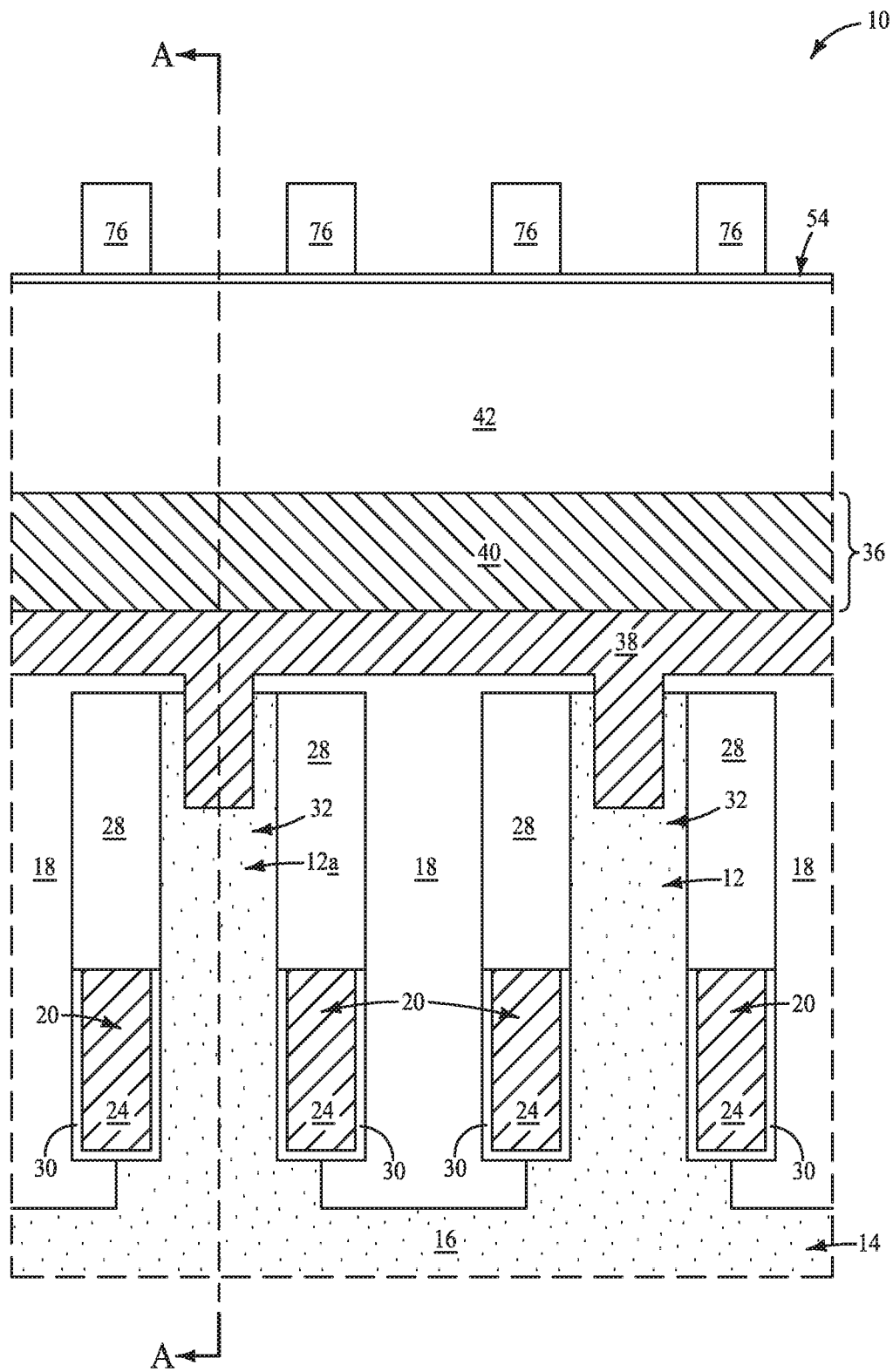

Referring to FIGS. 10-10B, insulative material 76 is provided within the gaps 64 (FIGS. 9-9C), and then the masking material 62 (FIGS. 9-9C) is removed. The insulative material 76 may comprise any suitable composition(s); and in some embodiments may comprise, consist essentially of, or consist of silicon nitride.

Figure 11:
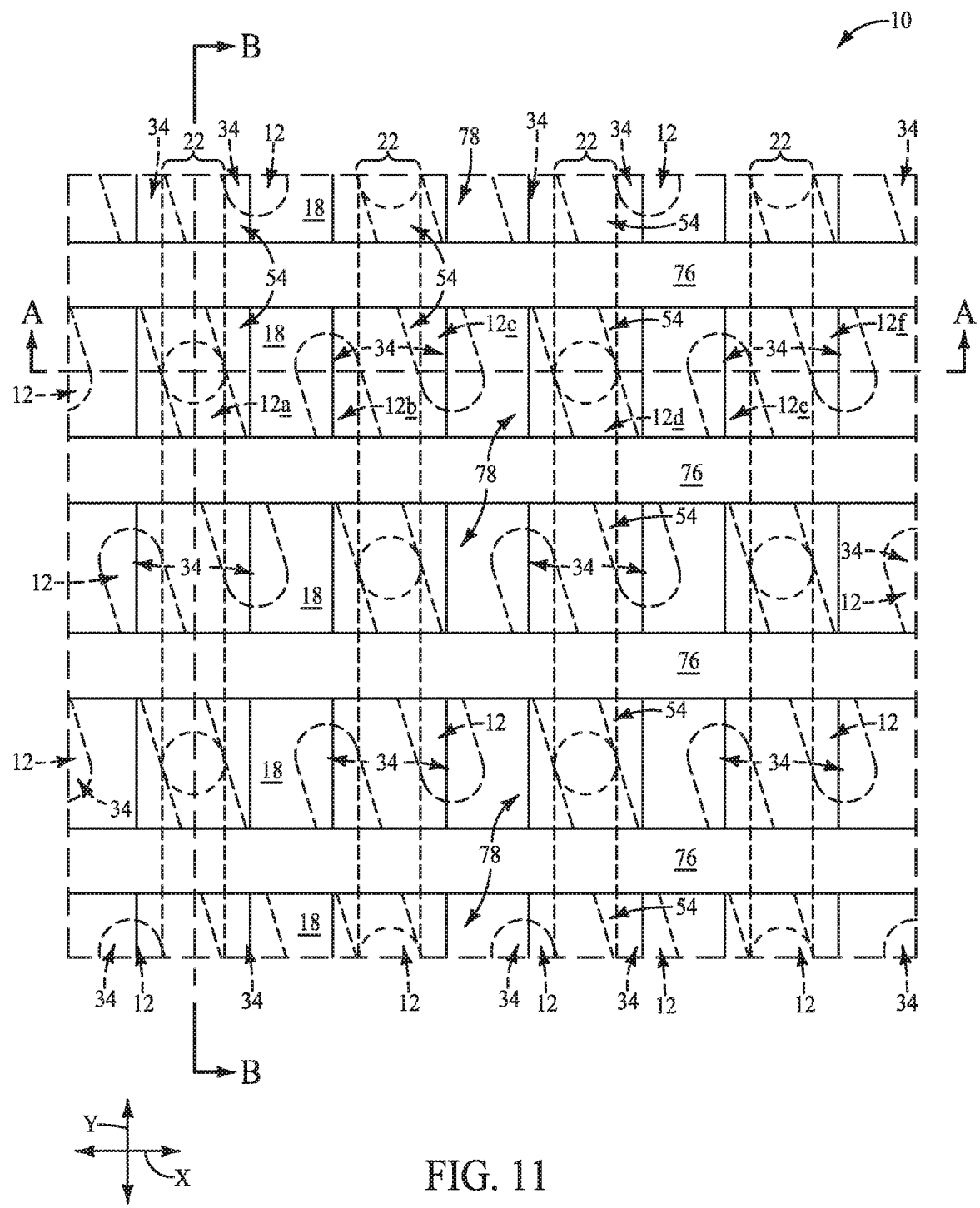
FIGS. 11-11B are diagrammatic views of the regions of the example construction of FIGS. 1-1C at an example process stage following that of FIGS. 10-10B.
Figure 11A:
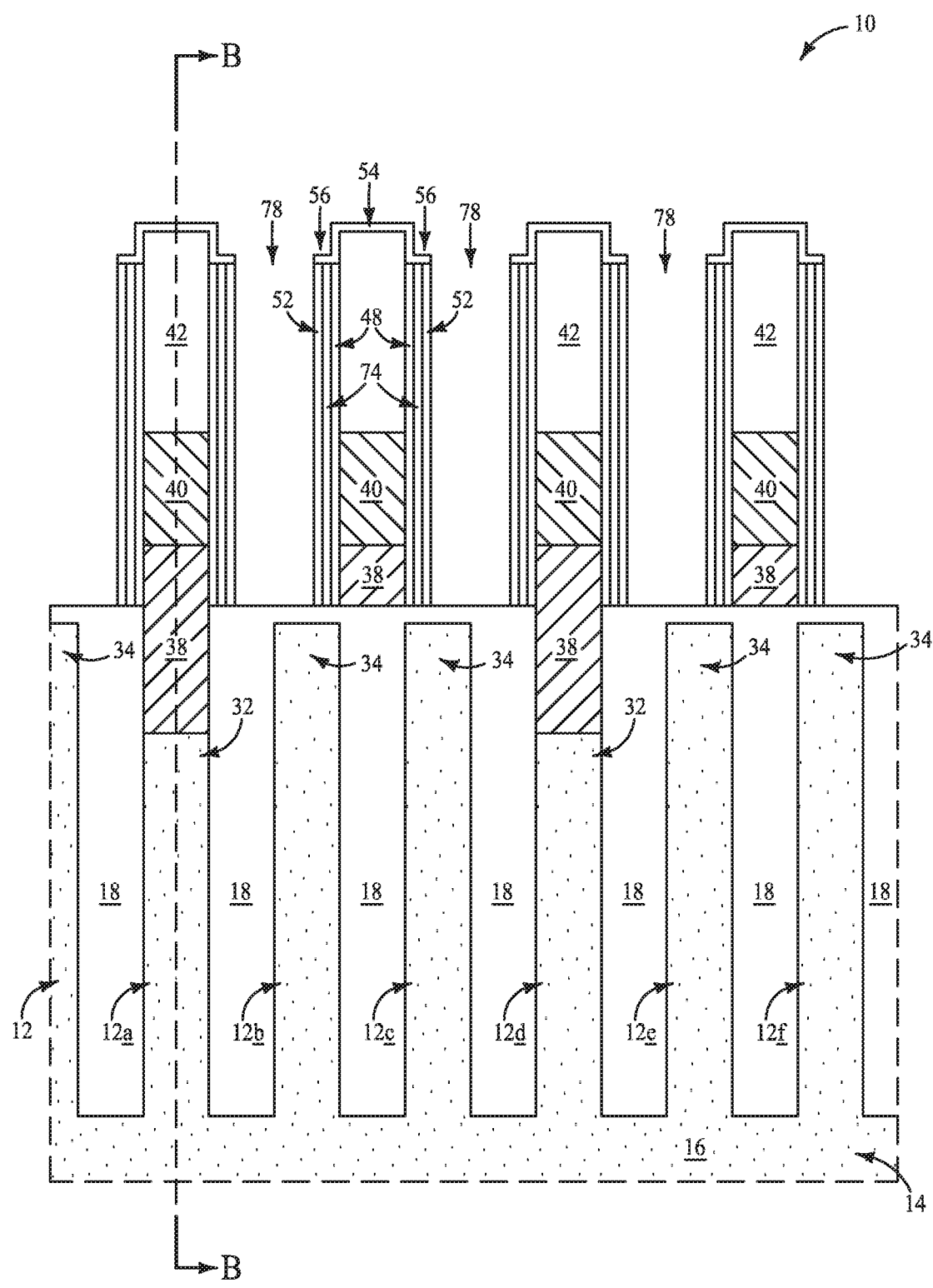
Figure 11B:
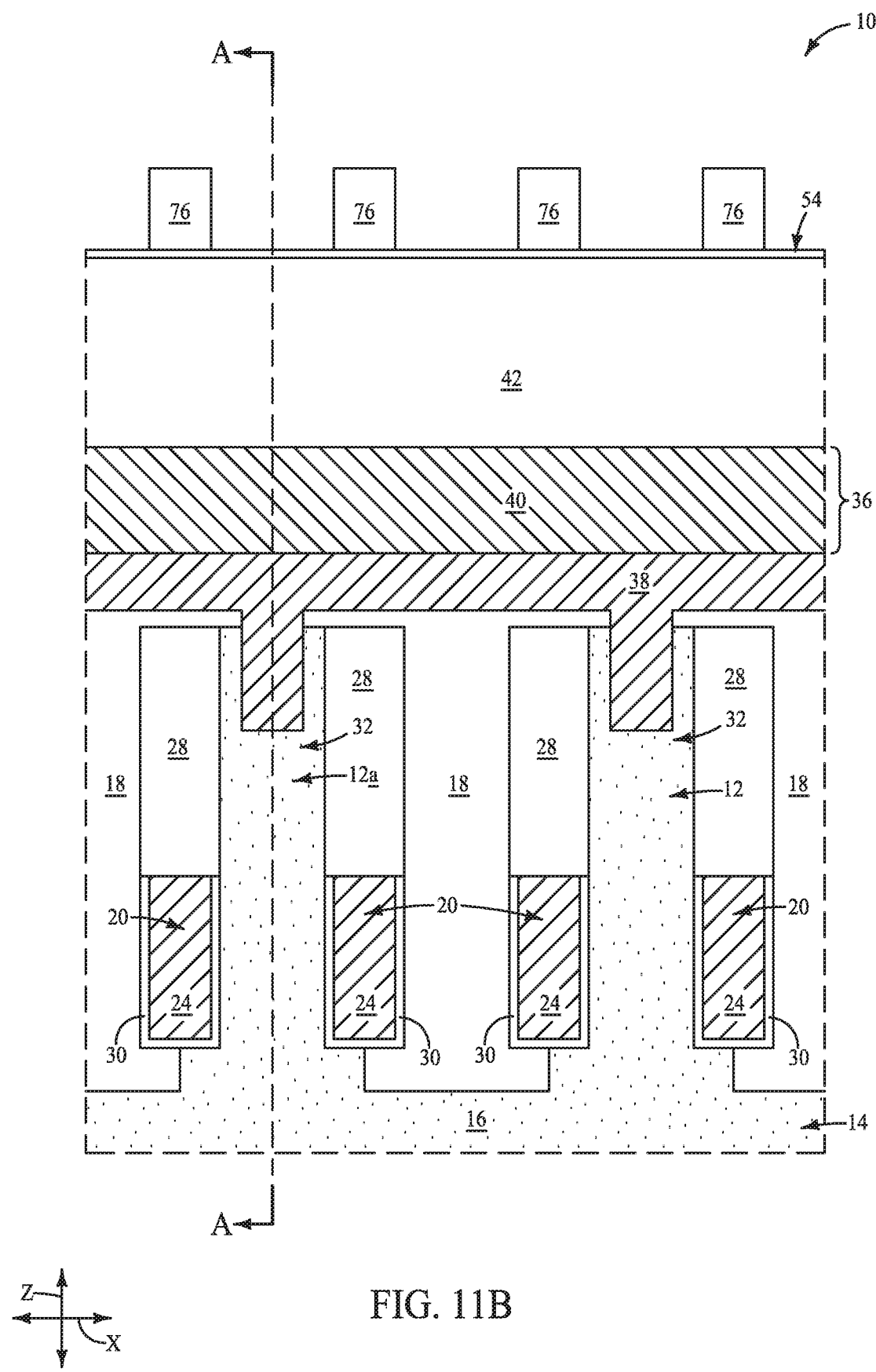

Referring to FIGS. 11-11B, the sacrificial material 58 (FIGS. 10-10B) is removed to leave openings 78.

Figure 12:
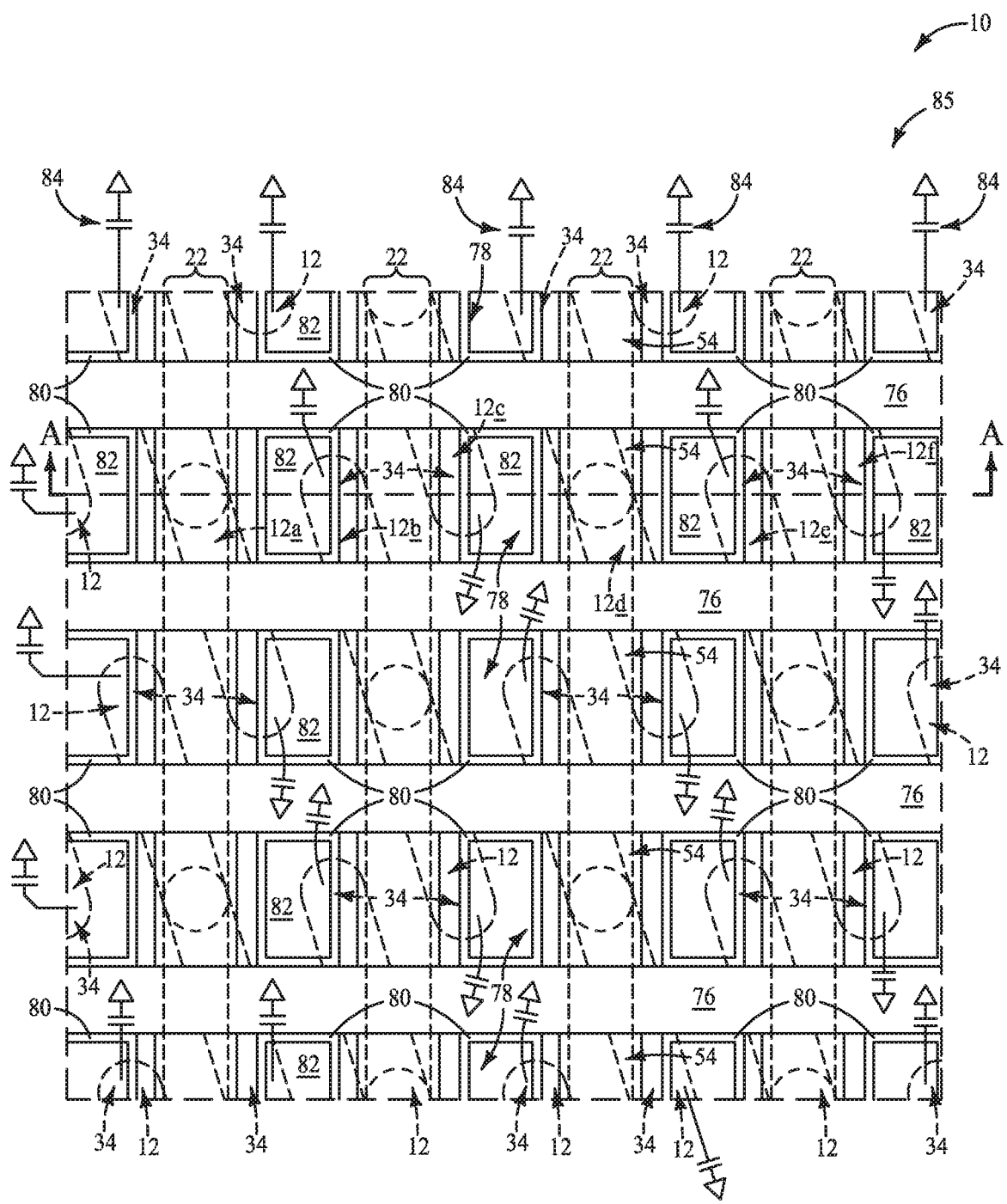
FIGS. 12 and 12A are diagrammatic views of the regions of the example construction of FIGS. 1-1C at an example process stage following that of FIGS. 11-11B.
Figure 12A:
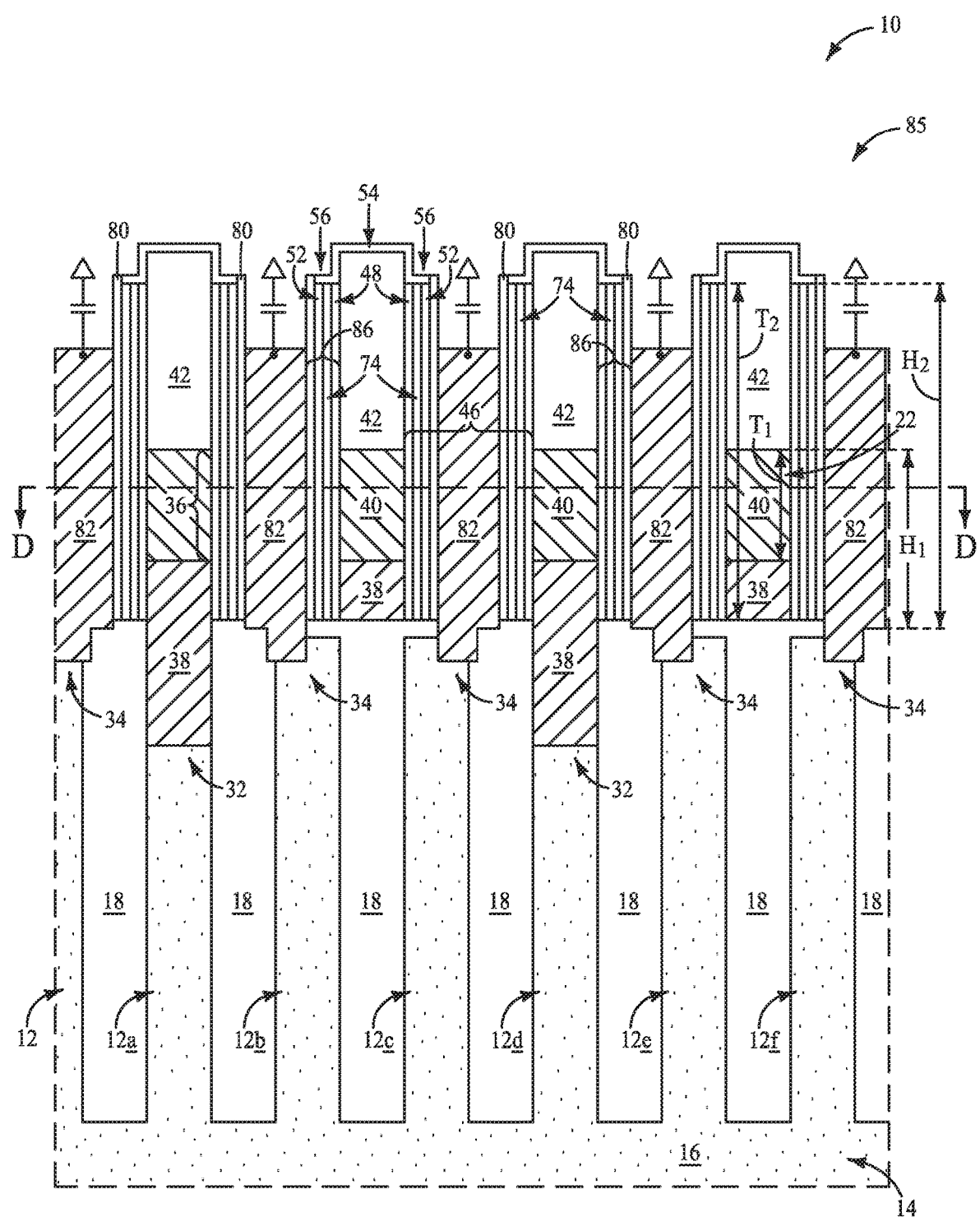

Referring to FIGS. 12 and 12A, lateral peripheries of the openings 78 (FIG. 11-11B) are lined with insulative material 80. The material 80 may comprise any suitable composition(s); and in some embodiments may comprise, consist essentially of, or consist of silicon nitride.

The storage-element-contacts (i.e., the storage-element-contact regions) 34 are exposed at the bottoms of the openings 78 (FIG. 11A), and then conductive material 82 is formed within the openings. The conductive material 82 is electrically coupled with the storage-element-contacts 34, and in the shown embodiment is directly against the semiconductor material 16 of the storage-element-contacts 34.

The conductive material 82 may comprise any suitable composition(s); and in some embodiments may comprise, consist essentially of, or consist of conductively-doped silicon. In some embodiments, the conductive material 82 may be referred to as storage-element-interconnect material, or simply as interconnect material.

Storage-elements 84 are electrically coupled with the storage-elements-contacts 34 through the conductive material 82. The storage-elements may be any suitable devices having at least two detectable states; and in some embodiments may be, for example, capacitors, resistive-memory devices, conductive-bridging devices, phase-change-memory (PCM) devices, programmable metallization cells (PMC), etc. In the shown embodiment, the storage-elements are capacitors. The capacitors each have one node coupled with the conductive material 82, and have another note coupled with a reference-voltage-source (shown as a triangle). The reference-voltage-source may be at any suitable reference voltage; including, for example, ground, VCC/2, etc.

The storage-elements may be considered to be comprised by memory cells of a memory array 85. Each of the memory cells is uniquely addressed by one of the digit lines 22 and one of the wordlines 20 (with the wordlines being described above with reference to FIGS. 1-1C). In some embodiments, the memory array may comprise dynamic random-access memory (DRAM); with each memory cell comprising an access transistor in combination with a storage element. The access transistors correspond to the transistors described above with reference to FIGS. 1-1C.

In some embodiments, the material 82 may be considered to correspond to conductive regions which are laterally spaced from the digit lines 22 by intervening regions 86 comprising the void regions 74. In some embodiments, the panels 48 may be considered to be insulative spacers along the sidewalls of the digit lines 22, with such insulative spacers extending continuously along the digit lines 22 throughout the memory array 85.

The conductive regions 82 are configured as segments which are laterally spaced from one another along the y-axis direction (which may be referred to as a first direction), as shown in FIG. 12.

In some embodiments, the digit lines 22 may be considered to extend to a first height $H_1$ over the underlying support material 18, and the void regions 74 may be considered to extend to a second height $H_2$ over such underlying support material. The second height may be at least about 30 nm greater than the first height.

An advantage of the illustrated embodiment of FIG. 12A is that the void regions 74 are at least as tall as the digit lines 22, and thus provide insulation along the entire dimension of the digit lines which overlaps with the interconnect material 82. Such may alleviate or prevent undesired parasitic capacitance between the digit lines and the interconnect material 82. In some embodiments, the metal-containing regions 36 of the digit lines have the first vertical thickness $T_1$ described above with reference to FIG. 1A, and the void regions 74 have a second vertical thickness $T_2$ which is greater than the first vertical thickness. The second vertical thickness may be at least about twice as large as the first vertical thickness, as shown along the cross-section of FIG. 12A.

Figure 13:
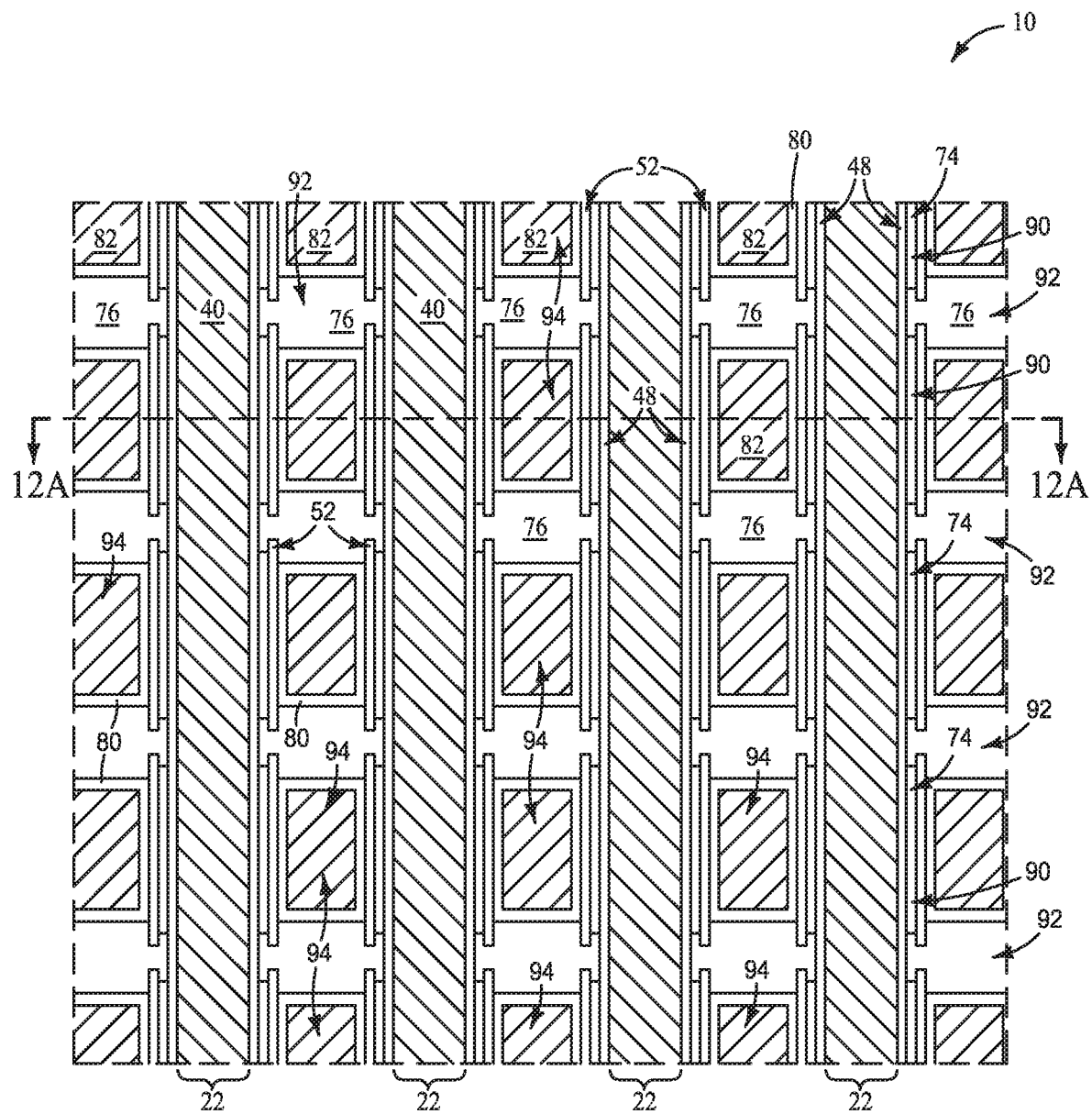
FIG. 13 is a diagrammatic cross-sectional top-down view of the assembly of FIGS. 12 and 12A in accordance with an example embodiment. The cross-section of FIG. 13 is along the line D-D of FIG. 12A, and the cross-section of FIG. 12A is along the line 12A-12A of FIG. 13.

FIG. 13 shows a view of the assembly 10 of FIG. 12A along the line D-D. Such shows the panels 48 configured as insulative spacers extending continuously along sidewalls of the digit lines 22, and shows the void regions 74 configured as void-region-segments 90 which are spaced from one another along the y-axis direction by insulative structures 92 comprising the insulative material 76 (e.g., silicon nitride). The conductive regions 82 are configured as segments 94 which are surrounded by the insulative material 80, and which are spaced from one another along the y-axis direction by regions comprising the insulative structures 92.

In some embodiments, the panels 48 and 52 may be considered to be first and second insulative spacers, respectively; with such first and second insulative spacers being spaced from one another by the void regions 74. In some embodiments, the second insulative spacers 52 may be considered to be between the void regions 74 and the conductive regions 82. The first and second insulative spacers (e.g., the panels 48 and 52) may comprise a same composition as one another, or may comprise different compositions relative to one another.

In some embodiments, the liner material 80 may be considered to correspond to third insulative spacers which surround the conductive regions 82. Regions of such third insulative spacers may be considered to be between the second insulative spacers 52 and the conductive regions 82. The third insulative spacers (e.g., material 80) may comprise a same composition as one or both of the first and second insulative spacers (e.g., panels 48 and 52), or may comprise a different composition than one or both of the first and second insulative spacers.

Figure 14:
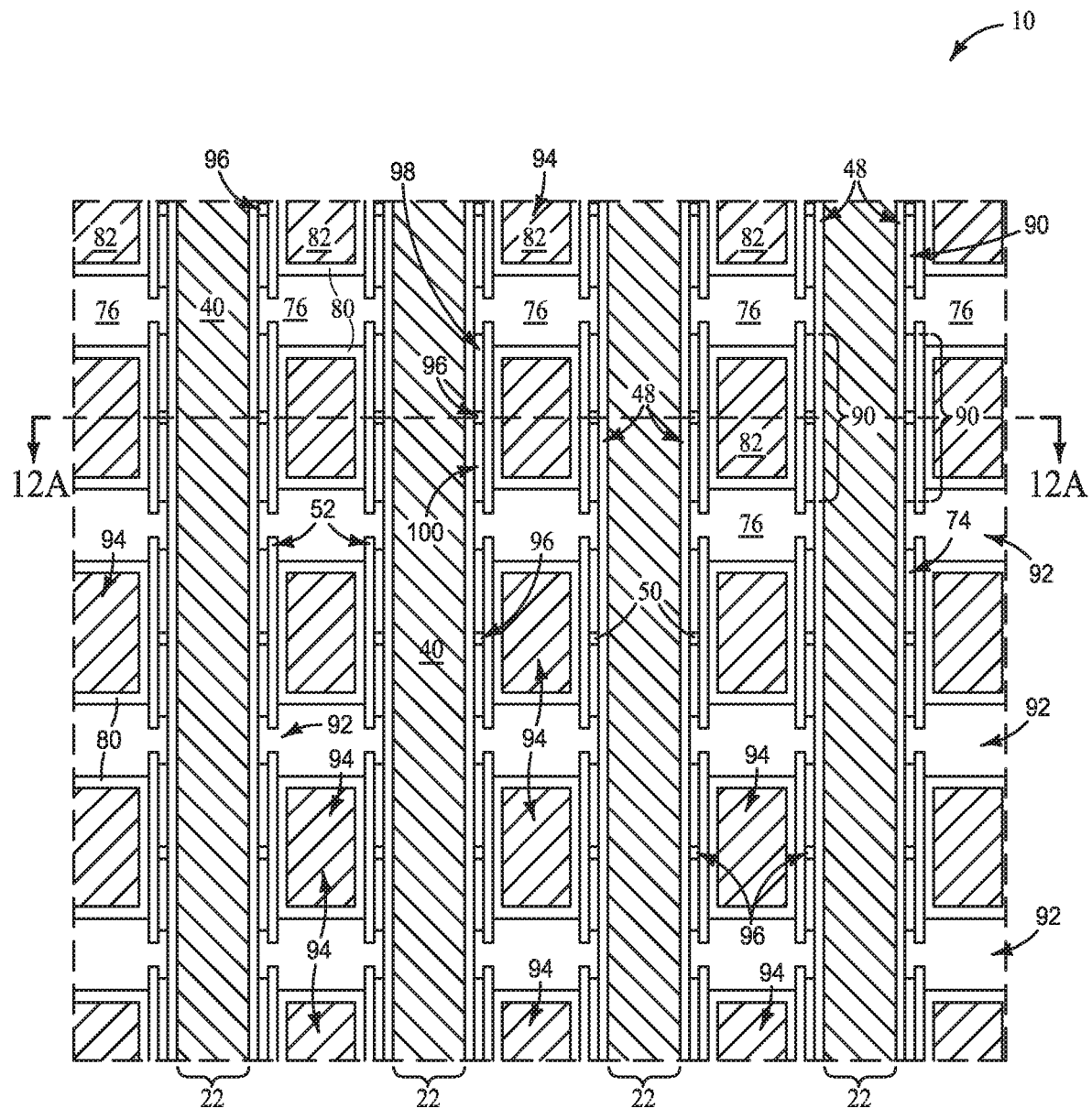
FIG. 14 is a diagrammatic cross-sectional top-down view of the assembly of FIGS. 12 and 12A in accordance with another example embodiment. The cross-section of FIG. 14 is along the line D-D of FIG. 12A, and the cross-section of FIG. 12A is along the line 12A-12A of FIG. 14.

The embodiment of FIG. 13 has all of the film 50 (FIG. 2A) removed to form the void-region-segments 90. In other embodiments some of the film 50 may remain within the void-region-segments 90, as shown in FIG. 14. The embodiment of FIG. 14 may be achieved by utilizing a timed etch to remove the film 50 at the processing stage of FIG. 9-9C so that only some of the film 50 is removed. The remaining portion of the film 50 may correspond to pillars 96 which assist in providing support across the void-region-segments 90 so that the void-region-segments do not undesirably collapse. If such collapse is not likely, the pillars 96 may be omitted.

In some embodiments, the pillars 96 may be considered to subdivide the void-region-segments 90 into void-region pairs, with such pairs including a first void-region 98 on one side of a pillar 96, and a second void-region 100 on an opposing side of the pillar 96.

In the illustrated embodiment, the insulative structures 92 are configured as bars which extend along the x-axis direction (which may also be referred to as a second direction).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having digit lines extending along a first direction. Each of the digit lines has a metal-containing region with a first vertical thickness. Void regions are adjacent to the digit lines and are spaced from the digit lines by insulative spacers. The void regions have a second vertical thickness which is at least about twice as large as the first vertical thickness. Conductive regions are laterally spaced from the digit lines by intervening regions comprising the void regions. Storage-elements are associated with the conductive regions.

Some embodiments include an integrated assembly having a memory array, and having digit lines extending along a first direction through the memory array. Insulative spacers are along sidewalls of the digit lines. The insulative spacers extend continuously along the digit lines through the memory array. Conductive regions are laterally spaced from the digit lines by intervening regions. The conductive regions are configured as segments spaced apart from one another along the first direction. The intervening regions include regions of the insulative spacers and include void regions adjacent the regions of the insulative spacers. The void regions are configured as void-region-segments which are spaced apart from one another along the first direction by insulative structures. Storage-elements are associated with the conductive regions.

Some embodiments include a method of forming an integrated assembly. A construction is formed to include, along a cross-section, a pair of digit lines spaced from one another by a spacing region. Each of the digit lines has a top surface, and a pair of opposing sidewall surfaces extending downwardly from the top surface. The construction includes first insulative material over the top surfaces. The first insulative material and digit lines together form beams which extend along a first direction perpendicular to the cross-section. The beams have sidewall surfaces. The digit lines have metal-containing regions. The construction includes a storage-element-contact below the metal-containing regions of the digit lines and within the spacing region. Rails are formed along the sidewall surfaces. Each of the rails comprises a film sandwiched between a pair of panels, and comprises an insulative cap over the film and the panels. The pair of panels are an inner panel proximate one of the sidewall surfaces of the digit lines and an outer panel on an opposing side of the film from the inner panel. The outer panels are etched into to expose the film. The etching is conducted in one or more regions distal from the cross-section. After the etching, the rails retain the configuration along the cross-section of the film between the pair of the panels and under the insulative cap. At least some of the film is removed to leave voids within the rails along the cross-section. The voids within the rails are between the panels of the rails and under the insulative caps of the rails along the cross-section. The storage-element-contact is exposed. A storage-element is formed over the storage-element contact and is coupled with the storage-element-contact.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   digit lines extending along a first direction; each of the digit lines having a metal-containing region having a first vertical thickness;
   void regions adjacent the digit lines and spaced from the digit lines by insulative spacers; the void regions extending elevationally higher than the metal-containing region, extending elevationally lower that the metal-containing region and having a second vertical thickness which is at least twice as large as the first vertical thickness;
   conductive regions laterally spaced from the digit lines by intervening regions comprising the void regions; and
   storage-elements associated with the conductive regions.

2. The integrated assembly of claim 1 wherein the digit lines extend to a first height, and wherein the void regions extend to a second height which is at least 30 nm above the first height.

3. The integrated assembly of claim 2 wherein the first vertical thickness is less than or equal to 30 nm.

4. The integrated assembly of claim 1 comprising active-region-pillars extending upwardly from a base; each of the active-region-pillars having a pair of storage-element-contact-regions, and having a digit-line-contact-region between the storage-element-contact-regions; the digit lines being coupled with the digit-line-contact-regions, and the conductive regions being coupled with the storage-element-contact-regions.

5. The integrated assembly of claim 4 wherein the metal-containing regions of the digit lines are coupled to the digit-line-contact-regions through conductively-doped semiconductor material.

6. The integrated assembly of claim 5 wherein the conductively-doped semiconductor material comprises conductively-doped silicon.

7. The integrated assembly of claim 1 wherein the storage-elements are capacitors.

8. An integrated assembly, comprising:
   a memory array;
   digit lines extending along a first direction through the memory array;
   first insulative spacers along sidewalls of the digit lines; the insulative spacers extending continuously along the digit lines through the memory array;
   conductive regions laterally spaced from the digit lines by intervening regions; the conductive regions being configured as segments spaced apart from one another along the first direction; the intervening regions including regions of the insulative spacers and including void regions adjacent the regions of the insulative spacers; the void regions having a first side in direct contact with the first insulative spacer and an opposing second side in direct contact with a second insulative spacer, the void regions being configured as void-region-segments which are spaced apart from one another along the first direction by insulative structures; and
   storage-elements associated with the conductive regions.

9. The integrated assembly of claim 8 comprising pillars of insulative material extending upwardly through the void-region segments and subdividing each of said void-region-segments into void-region-pairs.

10. The integrated assembly of claim 9 wherein the insulative material of the pillars comprises a low-k composition.

11. The integrated assembly of claim 9 wherein the insulative material of the pillars comprises porous silicon dioxide.

12. The integrated assembly of claim 9 wherein the insulative material of the pillars comprises carbon-doped silicon dioxide.

13. The integrated assembly of claim 12 wherein the carbon is present in the carbon-doped silicon dioxide to a concentration within a range of from 8 atomic percent to 13 atomic percent.

14. The integrated assembly of claim 8 wherein the insulative structures are configured as bars which extend along a second direction orthogonal to the first direction, and wherein said bars have regions between the spaced-apart conductive regions.

15. The integrated assembly of claim 8 wherein the insulative structures comprise silicon nitride.

16. The integrated assembly of claim 8 wherein the first and second insulative spacers comprise a same composition as one another.

17. The integrated assembly of claim 8 wherein the first and second insulative spacers comprise silicon nitride.

18. The integrated assembly of claim 8 wherein the first and second insulative spacers comprise different compositions relative to one another.

19. The integrated assembly of claim 8 wherein the intervening regions include regions of third insulative spacers; and wherein the third insulative spacers are between the second insulative spacers and the conductive regions.

20. The integrated assembly of claim 19 wherein at least one of the first, second and third insulative spacers comprises a same composition as another of the first, second and third insulative spacers.

21. The integrated assembly of claim 20 wherein the first, second and third insulative spacers comprise silicon nitride.

22. The integrated assembly of claim 19 wherein at least one of the first, second and third insulative spacers comprises a different composition relative to another of the first, second and third insulative spacers.

\* \* \* \* \*